(12) United States Patent
Kim et al.

(10) Patent No.: US 12,009,346 B2
(45) Date of Patent: Jun. 11, 2024

(54) SEMICONDUCTOR DEVICE AND METHOD OF FABRICATING THE SAME

(71) Applicant: Samsung Electronics Co., Ltd., Suwon-si (KR)

(72) Inventors: Sung Min Kim, Incheon (KR); Dae Won Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/328,389

(22) Filed: Jun. 2, 2023

(65) Prior Publication Data
US 2023/0307423 A1 Sep. 28, 2023

Related U.S. Application Data

(63) Continuation of application No. 17/463,650, filed on Sep. 1, 2021, now Pat. No. 11,705,435, which is a
(Continued)

(30) Foreign Application Priority Data

Aug. 24, 2018 (KR) ........................ 10-2018-0099413

(51) Int. Cl.
*H01L 21/768* (2006.01)
*H01L 23/00* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS

| 8,669,135 B2 | 3/2014 | Kao et al. |
| 9,837,534 B2 | 12/2017 | Yokoyama |

(Continued)

FOREIGN PATENT DOCUMENTS

| JP | 2015-065281 A | 4/2015 |
| JP | 2015-095517 A | 5/2015 |

(Continued)

OTHER PUBLICATIONS

Korean Office Action dated Aug. 22, 2022 issued in corresponding Korean Patent Application No. 10-2018-0099413.

(Continued)

*Primary Examiner* — Hsien Ming Lee
(74) *Attorney, Agent, or Firm* — Harness, Dickey & Pierce, P.L.C.

(57) ABSTRACT

A device includes a lower semiconductor substrate, a lower gate structure on the lower semiconductor substrate, the lower gate structure comprises a lower gate electrode, a lower interlayer insulating film on the lower semiconductor substrate, an upper semiconductor substrate on the lower interlayer insulating film, an upper gate structure on the upper semiconductor substrate, and an upper interlayer insulating film on the lower interlayer insulating film, the upper interlayer insulating film covers sidewalls of the upper semiconductor substrate The upper gate structure comprises an upper gate electrode extending in a first direction and gate spacers along sidewalls of the upper gate electrode. The upper gate electrode comprises long sidewalls extending in the first direction and short sidewalls in a second direction The gate spacers are on the long sidewalls of the upper gate electrode and are not disposed on the short sidewalls of the upper gate electrode.

20 Claims, 31 Drawing Sheets

Related U.S. Application Data continuation of application No. 16/508,857, filed on Jul. 11, 2019, now Pat. No. 11,139,271.

(51) Int. Cl.
  *H01L 23/48* (2006.01)
  *H01L 25/00* (2006.01)
  *H01L 25/065* (2023.01)

(52) U.S. Cl.
  CPC .............. *H01L 24/08* (2013.01); *H01L 24/80* (2013.01); *H01L 25/50* (2013.01); *H01L 2224/08145* (2013.01); *H01L 2224/80894* (2013.01); *H01L 2225/06524* (2013.01); *H01L 2225/06544* (2013.01); *H01L 2225/06593* (2013.01)

(56) References Cited

U.S. PATENT DOCUMENTS

| | | |
|---|---|---|
| 11,139,271 B2 | 10/2021 | Kim et al. |
| 2006/0115944 A1 | 6/2006 | Kwak et al. |
| 2006/0237725 A1 | 10/2006 | Jeong et al. |
| 2007/0145367 A1 | 6/2007 | Chen et al. |
| 2007/0181953 A1 | 8/2007 | Lyu et al. |
| 2008/0061443 A1 | 3/2008 | Park |
| 2008/0165521 A1 | 7/2008 | Bernstein et al. |
| 2009/0026256 A1 | 1/2009 | Kameda |
| 2009/0026526 A1 | 1/2009 | Cho et al. |
| 2011/0127595 A1* | 6/2011 | Cho .................. H01L 21/76898 257/296 |
| 2013/0020642 A1 | 1/2013 | Basker et al. |
| 2013/0075731 A1 | 3/2013 | Han et al. |
| 2015/0076578 A1 | 3/2015 | Sakamoto et al. |
| 2015/0115330 A1 | 4/2015 | Park et al. |
| 2016/0225741 A1 | 8/2016 | Du et al. |
| 2018/0098407 A1 | 4/2018 | Kazanchian |

FOREIGN PATENT DOCUMENTS

| | | |
|---|---|---|
| KR | 2000/0045418 A | 7/2000 |
| KR | 100450788 B1 | 9/2004 |
| KR | 100714401 B1 | 5/2007 |
| KR | 100957185 B1 | 5/2010 |

OTHER PUBLICATIONS

Notice of Allowance dated Feb. 9, 2023, issued in corresponding Korean Patent Application No. 10-2018-0099413.
Office Action for Taiwanese Application No. 108124366 dated Mar. 11, 2023.

* cited by examiner

SEMICONDUCTOR DEVICE AND METHOD OF FABRICATING THE SAME

This application is a continuation of U.S. application Ser. No. 17/463,650, filed on Sep. 1, 2021 which is a continuation of U.S. application Ser. No. 16/508,857, filed on Jul. 11, 2019, which claims priority to Korean Patent Application No. 10-2018-0099413, filed on Aug. 24, 2018, and all the benefits accruing therefrom under 35 U.S.C. § 119, the disclosure of each of which is incorporated herein by reference in its entirety.

BACKGROUND

Example embodiments relates to a semiconductor device and/or a method of fabricating the same, and more particularly, to a three-dimensionally stacked semiconductor device and/or a method of fabricating the same.

As one of the scaling techniques for increasing the density of a semiconductor device, a multi-gate transistor has been suggested. The multi-gate transistor is obtained by forming a fin- or nanowire-shaped multi-channel active pattern, e.g. a silicon body, on a substrate and forming gates on the surface of the multi-channel active pattern. However, the techniques for increasing the density of a semiconductor device are approaching scaling limits.

In order to increase the density of a semiconductor device, a semiconductor device stacked three-dimensionally through wafer bonding is being proposed. Such a three-dimensionally stacked semiconductor device not only increases the density of a semiconductor device, but also integrates different types of integrated circuits into one semiconductor chip.

SUMMARY

Aspects of example embodiments provide a semiconductor device having improved integration density and performance, by increasing alignment accuracy between an integrated circuit formed on a lower semiconductor substrate and an integrated circuit formed on an upper semiconductor substrate.

Aspects of example embodiments also provide a method of fabricating a semiconductor device, the method capable of improving element integration density and performance by increasing alignment accuracy between an integrated circuit formed on a lower semiconductor substrate and an integrated circuit formed on an upper semiconductor substrate.

According to some example embodiments of example embodiments, there is provided a semiconductor device, comprising a lower semiconductor substrate, a lower gate structure on the lower semiconductor substrate, the lower gate structure comprising a lower gate electrode, a lower interlayer insulating film on the lower semiconductor substrate, the lower interlayer insulating film covering the lower gate structure, an upper semiconductor substrate on the lower interlayer insulating film, an upper gate structure on the upper semiconductor substrate, and an upper interlayer insulating film on the lower interlayer insulating film, the upper interlayer insulating film covering sidewalls of the upper semiconductor substrate. The upper gate structure comprises an upper gate electrode extending in a first direction, and upper gate spacers extending along sidewalls of the upper gate electrode. The upper gate electrode comprises long sidewalls extending in the first direction, and short sidewalls extending in a second direction, the second direction different from the first direction. The upper gate spacers are on the long sidewalls of the upper gate electrode and are not on the short sidewalls of the upper gate electrode.

According to some example embodiments of example embodiments, there is provided a semiconductor device, comprising a lower semiconductor substrate comprising a first region and a second region, a lower gate structure on the lower semiconductor substrate, the lower gate structure comprising a lower gate electrode, an upper semiconductor substrate on the lower semiconductor substrate of the first region, the upper semiconductor substrate comprising a first surface and a second surface opposite the first surface, a plurality of upper gate structures on the first surface of the upper semiconductor substrate, each of the plurality of upper gate structures comprising an upper gate electrode, a plurality of upper source/drain regions on at least one side of each respective one of the upper gate structures, and an etch stop layer extending along the first surface of the upper semiconductor substrate. The etch stop layer is on the first region of the lower semiconductor substrate.

According to some example embodiments of example embodiments, there is provided a semiconductor device, comprising a lower semiconductor substrate comprising a first region and a second region defined around the first region, a plurality of lower transistors in the lower semiconductor substrate, the plurality of lower transistors comprising a plurality of lower gate structures and a plurality of lower source/drain regions, the plurality of lower gate structures extending in a first direction, and the plurality of lower source/drain regions being between the plurality of lower gate structures, a lower interlayer insulating film on the lower semiconductor substrate, the lower interlayer insulating film covering both the plurality of lower gate structures and the plurality of lower source/drain regions, an upper semiconductor substrate on the lower interlayer insulating film of the first region, an upper interlayer insulating film on the lower interlayer insulating film, the upper interlayer insulating film covering sidewalls of the upper semiconductor substrate, a plurality of upper transistors in the upper semiconductor substrate, the plurality of upper transistors being at positions overlapping the first region of the lower semiconductor substrate, the plurality of upper transistors comprising a plurality of upper gate structures and a plurality of upper source/drain regions, the plurality of upper gate structures extending in the first direction, and the plurality of upper source/drain regions being between the plurality of upper gate structures, a first connection contact connecting at least one of the plurality of upper gate structures to at least one of the plurality of lower transistors, and a second connection contact connecting at least one of the plurality of upper source/drain regions to at least one of the plurality of lower transistors. At least one of the first connection contact and the second connection contact penetrates the upper semiconductor substrate.

According to some example embodiments of example embodiments, there is provided a method of fabricating a semiconductor device, comprising forming, in a lower semiconductor substrate, a plurality of lower transistors, which comprise a plurality of lower gate structures and a plurality of lower source/drain regions; forming, on the lower semiconductor substrate, a lower interlayer insulating film, covering the plurality of lower gate structures and the plurality of lower source/drain regions; forming, in an upper semiconductor substrate, a plurality of upper transistors, which comprise a plurality of upper gate structures and a plurality of upper source/drain regions; bonding the upper semiconductor substrate onto the lower interlayer insulating film;

after the bonding of the upper semiconductor substrate onto the lower interlayer insulating film, performing a first etching process to remove some of the plurality of upper gate structures and some of the plurality of upper source/drain regions; after the bonding of the upper semiconductor substrate onto the lower interlayer insulating film, performing a second etching process to partially remove the upper semiconductor substrate; and after the first etching process and the second etching process, forming a connection contact, which connects at least one of the plurality of lower transistors and at least one of the plurality of upper transistors.

However, aspects of example embodiments are not restricted to the one set forth herein. The above and other aspects of example embodiments will become more apparent to one of ordinary skill in the art to which example embodiments pertains by referencing the detailed description of example embodiments given below.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
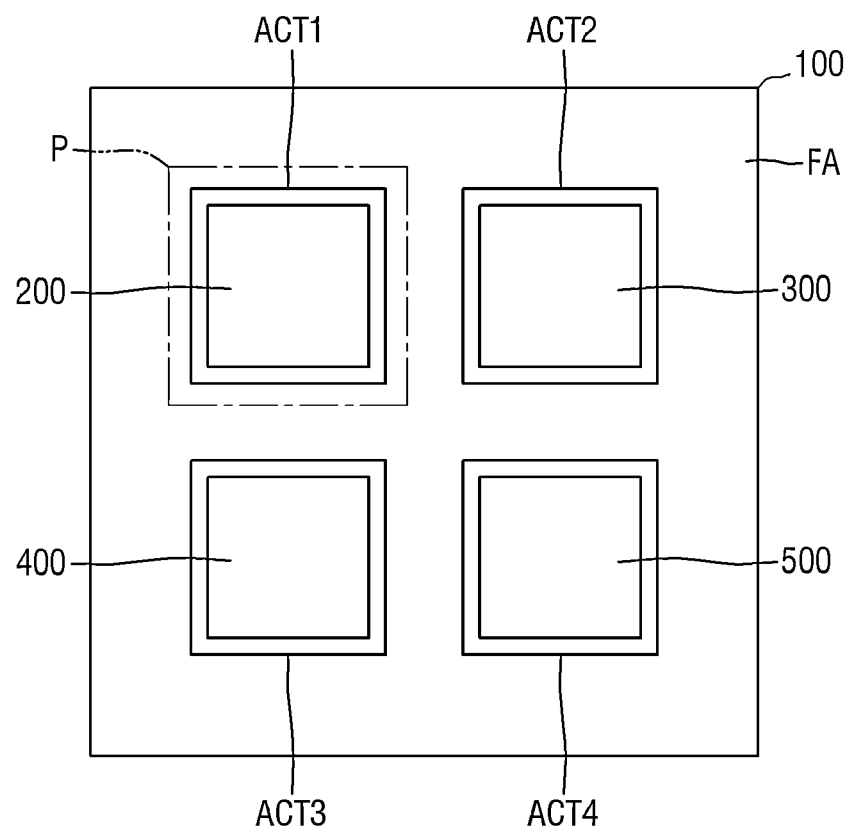
FIG. 1 is a layout view of a semiconductor device according to some example embodiments.

In the drawings relating to semiconductor devices according to some example embodiments, transistors formed on a lower semiconductor substrate and an upper semiconductor substrate are illustrated as being fin field effect transistors (FinFET), each including a channel region of a fin pattern shape. However, example embodiments is not limited thereto. In the semiconductor devices according to some example embodiments, each of, or at least some of, the transistors formed on the lower semiconductor substrate and the transistors formed on the upper semiconductor substrate may also include a planar transistor, a buried channel array transistor (BCAT), a recess channel array transistor (RCAT), a tunneling FET, a transistor including nanowires, a transistor including a nanosheet, or a vertical transistor.

In the drawings relating to the semiconductor devices according to some example embodiments, the transistor formed on the lower semiconductor substrate and the transistor formed on the upper semiconductor substrate are illustrated as being the same type of fin transistors, but example embodiments is not limited thereto. In the semiconductor devices according to some example embodiments, the transistor formed on the lower semiconductor substrate and the transistor formed on the upper semiconductor substrate may also be different types of transistors.

For example, a semiconductor element formed on the lower semiconductor substrate may be or include a semiconductor element including a memory cell, and a semiconductor element formed on the upper semiconductor substrate may be a logic element. For another example, a logic element may be formed on the lower semiconductor substrate, and a semiconductor element including a memory cell may be formed on the upper semiconductor substrate. The semiconductor element formed on the lower semiconductor substrate and the semiconductor element formed on the upper semiconductor substrate may also be or include logic elements including different transistor types.

The semiconductor element including the memory cell may be or include a volatile memory element or a nonvolatile memory element. The semiconductor element including the memory cell may be, but is not limited to, a dynamic random access memory (DRAM), a static random access memory (SRAM), and/or a flash memory.

Figure 2:
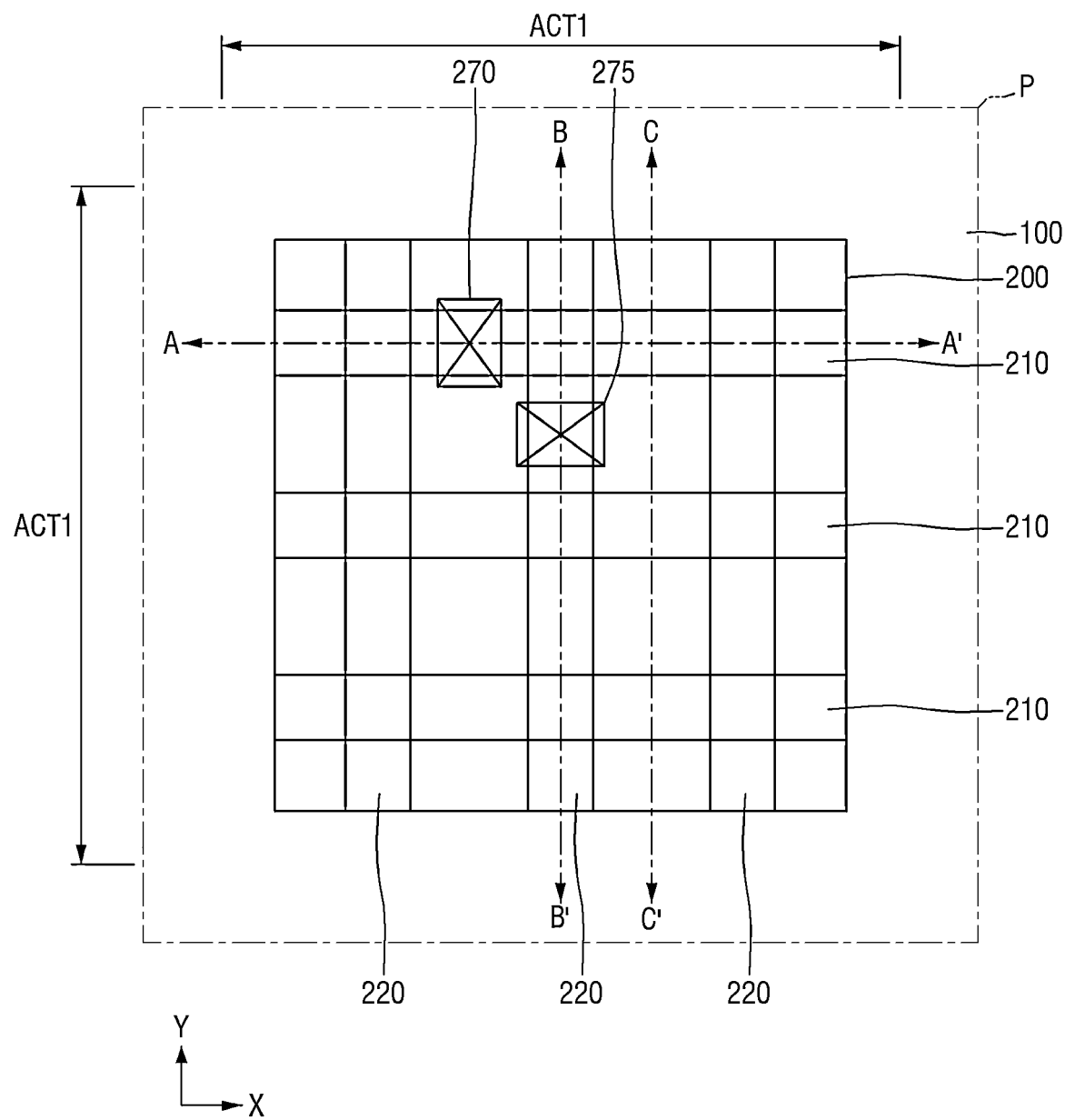
FIG. 2 is an enlarged view of a region P of FIG. 1.
Figure 3:
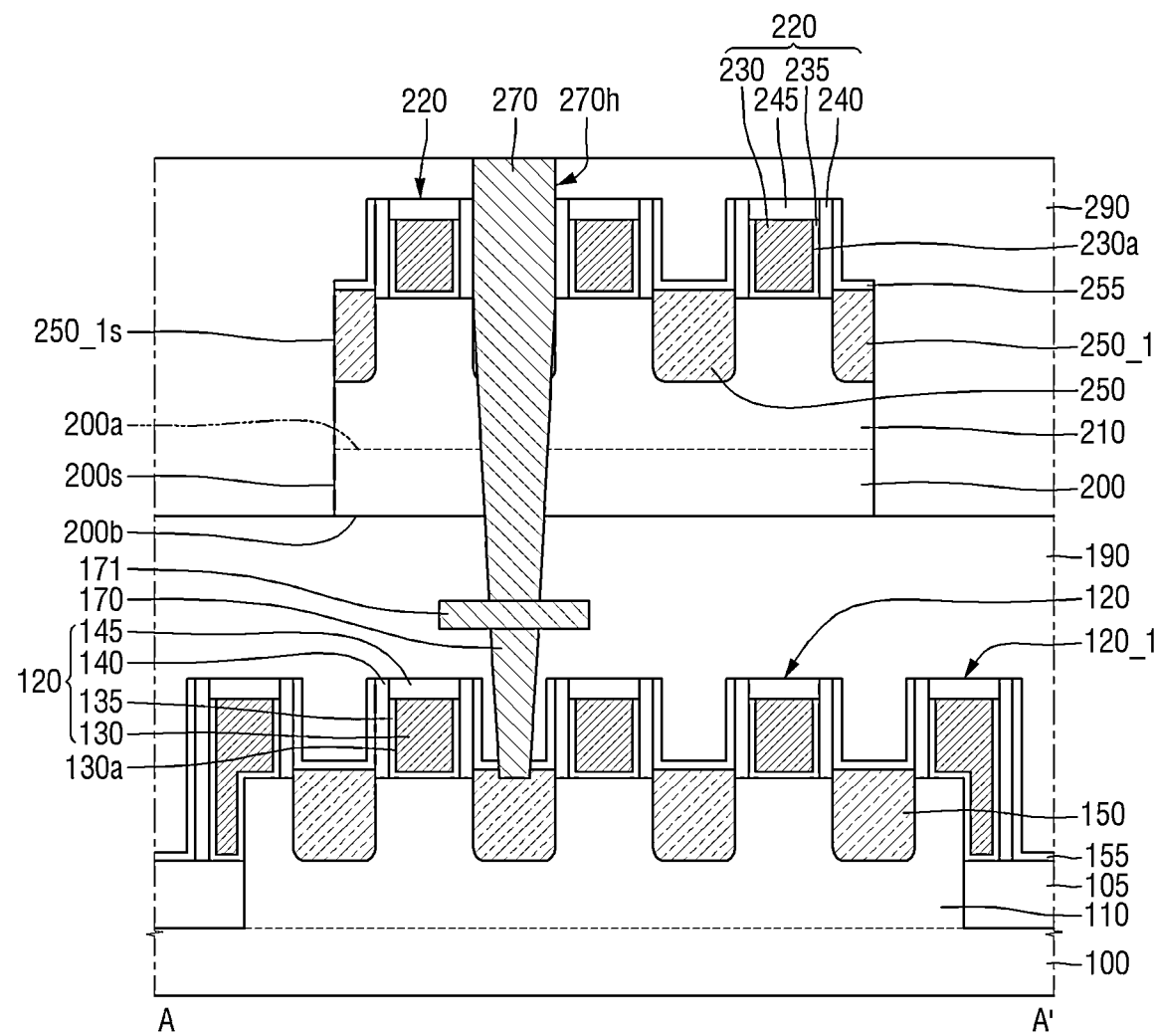
FIG. 3 is a cross-sectional view taken along line A-A' of FIG. 2.
Figure 4:
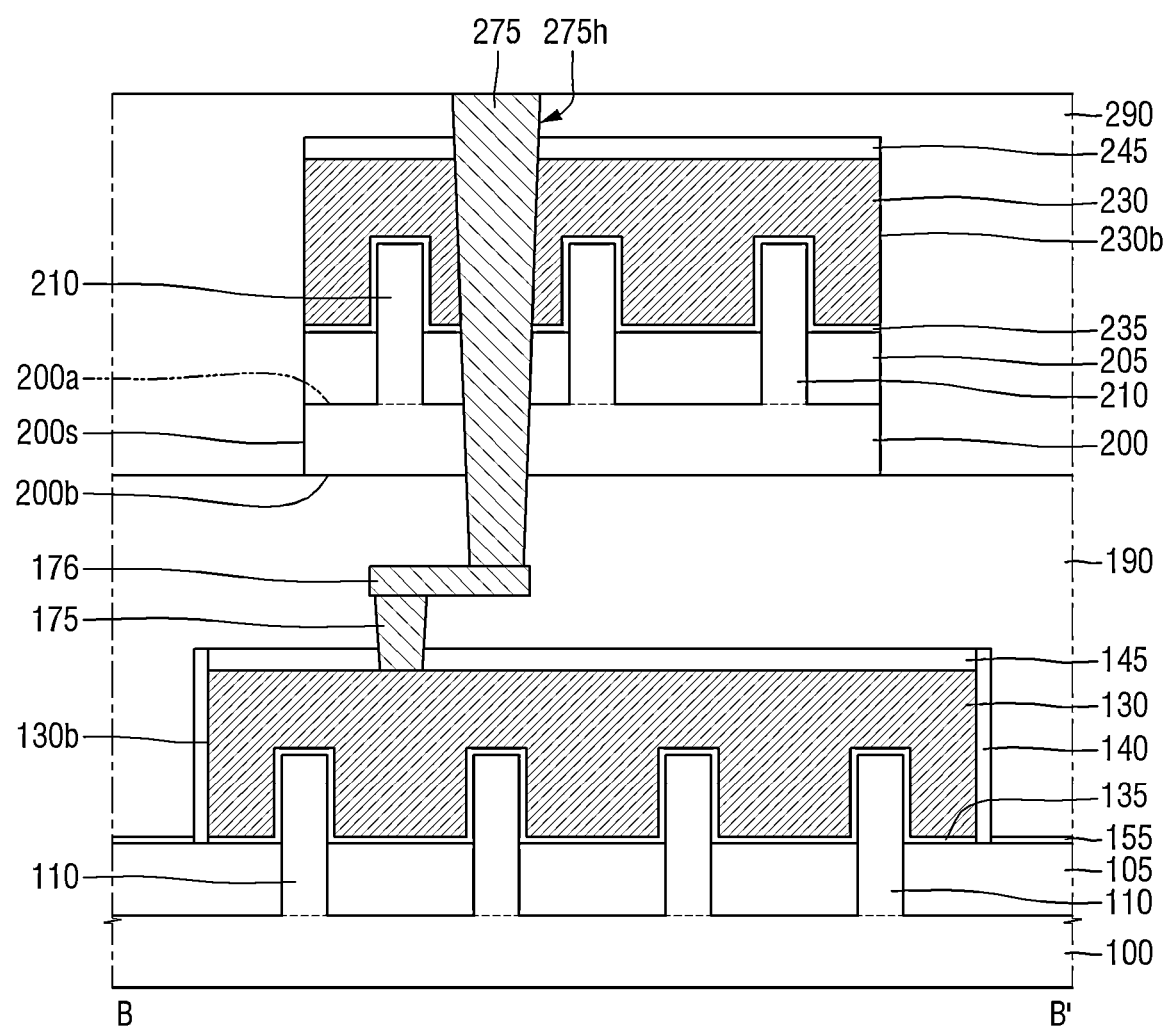
FIG. 4 is a cross-sectional view taken along line B-B' of FIG. 2.
Figure 5:
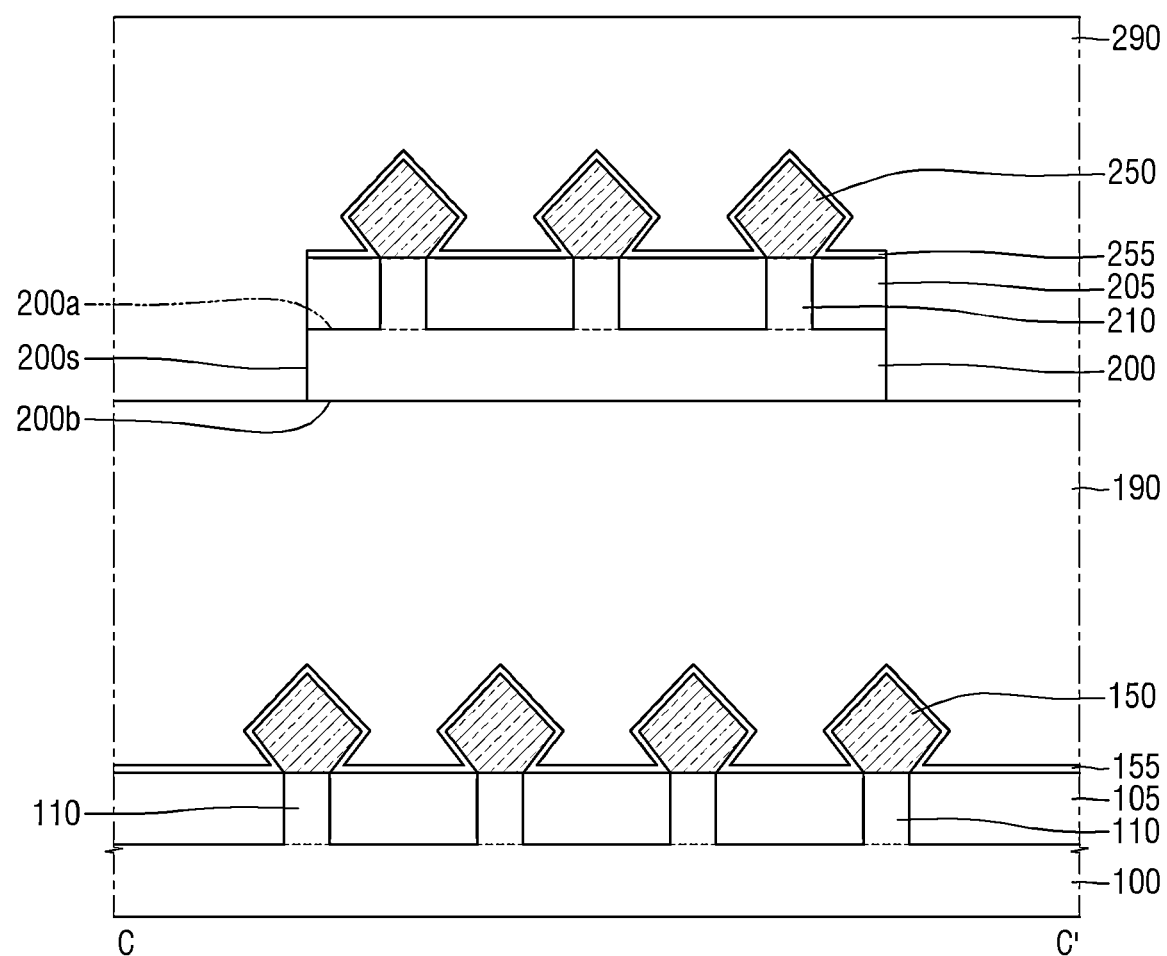
FIG. 5 is a cross-sectional view taken along line C-C' of FIG. 2.

FIG. 1 is a layout view of a semiconductor device according to some example embodiments. FIG. 2 is an enlarged view of a region P of FIG. 1. FIG. 3 is a cross-sectional view taken along line A-A' of FIG. 2. FIG. 4 is a cross-sectional view taken along line B-B' of FIG. 2. FIG. 5 is a cross-sectional view taken along line C-C' of FIG. 2. For reference, FIG. 2 illustrates a layout of only fin patterns and gate electrode structures formed on an upper semiconductor substrate.

In FIG. 1, a lower semiconductor substrate 100 may include first through fourth active regions ACT1 through ACT4. The lower semiconductor substrate 100 may include a field region FA defined around the first through fourth active regions ACT1 through ACT4.

Gate electrodes, source/drain regions, etc. may be formed on the lower semiconductor substrate 100 of the first through fourth active regions ACT1 through ACT4. The field region FA may be or include a region for electrically isolating the first through fourth active regions ACT1 through ACT4.

First through fourth upper semiconductor substrates 200 through 500 may be disposed on the lower semiconductor substrate 100 of the first through fourth active regions ACT1 through ACT4, respectively. The first through fourth upper semiconductor substrates 200 through 500 are formed by etching the same base substrate. Therefore, the first through fourth upper semiconductor substrates 200 through 500 may include the same material.

Since the first through fourth upper semiconductor substrates 200 through 500 are disposed on the lower semiconductor substrate 100, the size of the lower semiconductor substrate 100 may be larger than that of each of the first through fourth upper semiconductor substrates 200 through 500. For example, the width of the lower semiconductor substrate 100 in one direction is larger than the width of each of the first through fourth upper semiconductor substrates 200 through 500 in the same direction.

The first through fourth upper semiconductor substrates 200 through 500 are illustrated as being respectively disposed on the first through fourth active regions ACT1 through ACT4 and not disposed on the field region FA. However, this is merely an example used for ease of description, and example embodiments is not limited to this example. For example, a portion of each of the first through fourth upper semiconductor substrates 200 through 500 may also be disposed on the field region FA of the lower semiconductor substrate 100.

Although the first through fourth upper semiconductor substrates 200 through 500 are illustrated as partially covering the first through fourth active regions ACT1 through ACT4, respectively, example embodiments is not limited thereto.

In FIG. 1, the lower semiconductor substrate 100 is illustrated as including the first through fourth active regions ACT1 through ACT4, but example embodiments is not limited thereto.

In addition, although the first through fourth upper semiconductor substrates 200 through 500 are illustrated as being respectively disposed on the first through fourth active regions ACT1 through ACT4 of the lower semiconductor substrate 100, this is merely an example used for ease of description, and example embodiments is not limited to this example. For example, one upper semiconductor substrate may also be disposed over a plurality of active regions defined in the lower semiconductor substrate 100.

Elements (e.g., transistors) having the same and/or different structures may be formed in the first through fourth active regions ACT1 through ACT4.

Referring to FIGS. 2 through 5, the semiconductor device according to some example embodiments may include the lower semiconductor substrate 100, the first upper semiconductor substrate 200, a plurality of lower gate structures 120 and 120_1, a plurality of lower source/drain regions 150, a plurality of first upper gate structures 220, a plurality of first upper source/drain regions 250 and 250_1, an upper source/drain connection contact 270, and an upper gate connection contact 275.

Each of the lower semiconductor substrate 100 and the first upper semiconductor substrate 200 may be or include a bulk silicon substrate or a silicon-on-insulator (SOI) substrate. Otherwise, each of the lower semiconductor substrate 100 and the first upper semiconductor substrate 200 may be or include, but is not limited to, a silicon substrate or a substrate made of another material such as silicon germanium, silicon germanium-on-insulator (SGOI), indium antimonide, lead telluride, indium arsenide, indium phosphide, gallium arsenide, or gallium antimonide.

The first upper semiconductor substrate 200 may include a first surface 200a and a second surface 200b opposite each other. Sidewalls 200s of the first upper semiconductor substrate 200 may connect the first surface 200a of the first upper semiconductor substrate 200 to the second surface 200b of the first upper semiconductor substrate 200. The second surface 200b of the first upper semiconductor substrate 200 may face the lower semiconductor substrate 100.

A plurality of lower transistors may be formed on the lower semiconductor substrate 100. The lower transistors may include a plurality of lower fin patterns 110, the lower gate structures 120, and the lower source/drain regions 150. The lower transistors may be formed at positions where the lower fin patterns 110 intersect with the respective lower gate structures 120.

A plurality of upper transistors may be formed on the first upper semiconductor substrate 200. The upper transistors may include a plurality of first upper fin patterns 210, the first upper gate structures 220, and the first upper source/drain regions 250. The upper transistors may be formed at positions where the first upper fin patterns 210 intersects with the respective first upper gate structures 220.

The lower fin patterns 110 may protrude from the lower semiconductor substrate 100. Each of the lower fin patterns 110 may extend in a first direction, e.g. direction X. Each of the lower fin patterns 110 may include long sides extending in the first direction X and short sides extending in a second direction, e.g. direction Y.

A lower field insulating layer 105 may be formed on the lower semiconductor substrate 100. The lower field insulating layer 105 may partially cover sidewalls of each of the lower fin patterns 110.

In FIGS. 3 and 4, a deep trench and/or a protruding pattern that defines the first active region ACT1 is not formed, but example embodiments are not limited thereto. Here, the deep trench may be or include a trench deeper than trenches defining the lower fin patterns 110. Unlike in the drawings, for example, a deep trench may be formed adjacent to outermost lower fin patterns 110 so as to define the first active region ACT1. Alternatively or additionally, a protruding pattern may be formed adjacent to the outermost lower fin patterns 110 in order to define the first active region ACT1. Here, an upper surface of the protruding pattern may be covered with the lower field insulating layer 105.

The first upper fin patterns 210 may protrude from the first upper semiconductor substrate 200. For example, each of the first upper fin patterns 210 may protrude from the first surface 200a of the first upper semiconductor substrate 200.

Each of the first upper fin patterns 210 may extend in the first direction X. Each of the first upper fin patterns 210 may include long sides extending in the first direction X and short sides extending in the second direction Y.

In the description of the semiconductor device according to some example embodiments, the lower fin patterns 110 and the first upper fin patterns 210 are described as extending in the first direction X. However, example embodiments is not limited thereto, and the lower fin patterns 110 and the first upper fin patterns 210 may also extend in different directions. As an example, the lower fin patterns 110 may extend in the first direction X and the first upper fin patterns may extend in the second direction Y. As an example, the lower fin patterns 110 may extend in the second direction Y and the first upper fin patterns 210 may extend in the first direction X.

An upper field insulating layer 205 may be formed on the first surface 200a of the first upper semiconductor substrate 200. The upper field insulating layer 205 may partially cover sidewalls of each of the first upper fin patterns 210.

Each of the lower fin patterns 110 and the first upper fin patterns 210 may include an elemental semiconductor material such as silicon or germanium. Alternatively or additionally, each of the lower fin patterns 110 and the first upper fin patterns 210 may include a compound semiconductor such as a group IV-IV compound semiconductor or a group III-V compound semiconductor. The group IV-IV compound semiconductor may be or include, e.g., a binary or ternary compound including two or more of carbon (C), silicon (Si), germanium (Ge) and tin (Sn) or a compound obtained by doping the binary or ternary compound with a group IV element. The group III-V compound semiconductor may be or include, e.g., a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

Each of the lower field insulating layer 105 and the upper field insulating layer 205 may include at least one of, for example, a silicon oxide layer, a silicon nitride layer, or a silicon oxynitride layer.

In FIGS. 3 and 4, four lower fin patterns 110 and three first upper fin patterns 210 are disposed in the first active region ACT1, but example embodiments is not limited thereto. In addition, the number of the lower fin patterns 110 and the number of the first upper fin patterns 210 disposed in the first active region ACT1 are different, but example embodiments is not limited thereto.

In FIG. 2, the short sides of the first upper fin patterns 210 are aligned in a line along the second direction Y. However, this is merely an example used for ease of description, and example embodiments is not limited to this example.

If the first upper semiconductor substrate 200 is, for example, an SOI substrate, the first upper semiconductor substrate 200 may have a shape in which a base semiconductor substrate, an insulating layer on the base semiconductor substrate, e.g. a buried oxide layer, and the first upper fin patterns 210 on the insulating layer are sequentially disposed, e.g. stacked.

Alternatively, if the first upper fin patterns 210 are formed using an SOI substrate, the first upper semiconductor substrate 200 may be or include an insulating layer, not a semiconductor layer.

If portions of the first upper semiconductor substrate 200 disposed under the first upper fin patterns 210 are all removed during a fabrication process of bonding the first upper semiconductor substrate 200 to the lower semiconductor substrate 100, only the first upper fin patterns 210 may remain on a lower interlayer insulating film 190.

The lower gate structures 120 and 120_1 may extend in the second direction Y on the lower field insulating layer 105. The lower gate structures 120 and 120_1 may be disposed on the lower fin patterns 110 to intersect the lower fin patterns 110, respectively. The lower gate structures 120 and 120_1 may include dummy lower gate structures 120_1 which intersect ends of the lower fin patterns 110, and lower gate structures 120 which do not intersect the ends of the lower fin patterns 110.

Each of the lower gate structures 120 and 120_1 may include lower gate spacers 140, a lower gate insulating layer 135, a lower gate electrode 130, and/or a lower capping pattern 145. The lower gate insulating layer 135 may be formed along sidewalls of the lower gate spacers 140 and the profile of the lower fin patterns 110. The lower gate electrode 130 may be formed on the lower gate insulating layer 135. The lower capping pattern 145 may be formed on the lower gate electrode 130 and disposed between the lower gate spacers 140.

The lower gate electrode 130 may include long sidewalls 130a extending in the second direction Y and short sidewalls 130b extending in the first direction X. The lower gate spacers 140 may be disposed on the long sidewalls 130a of the lower gate electrode 130 and the short sidewalls 130b of the lower gate electrode 130. The lower gate spacers 140 on the long sidewalls 130a of the lower gate electrode 130 may include the same material as or a different material from the lower gate spacers 140 on the short sidewalls 130b of the lower gate electrode 130.

The first upper gate structures 220 may extend in the second direction Y on the upper field insulating layer 205. The first upper gate structures 220 may be disposed on the first upper fin patterns 210 to intersect the first upper fin patterns 210. The first upper gate structures 220 may be disposed at positions overlapping the first active region ACT1 of the lower semiconductor substrate 100. The first upper gate structures 220 may be disposed on the first surface 200a of the first upper semiconductor substrate 200.

Each of, or at least some of, the first upper gate structures 220 may include upper gate spacers 240, an upper gate insulating layer 235, an upper gate electrode 230, and an upper capping pattern 245. The upper gate insulating layer 235 may be formed along sidewalls of the upper gate spacers 240 and the profile of the first upper fin patterns 210. The upper gate electrode 230 may be formed on the upper gate insulating layer 235. The upper capping pattern 245 may be formed on the upper gate electrode 230 and disposed between the upper gate spacers 240.

The upper gate electrode 230 may include long sidewalls 230a extending in the second direction Y, and short sidewalls 230b extending in the first direction X. The upper gate spacers 240 may be disposed on the long sidewalls 230a of the upper gate electrode 230. The upper gate spacers 240 are not disposed on the short sidewalls 230b of the upper gate electrode 230. The short sidewalls 230b of the upper gate electrode 230 and the sidewalls 200s of the first upper semiconductor substrate 200 may be arranged side by side in a thickness direction of the first upper semiconductor substrate 200. The short sidewalls 230b of the upper gate electrode 230, sidewalls of the upper field insulating layer 205, and the sidewalls 200s of the first upper semiconductor substrate 200 may have a continuous profile.

In the semiconductor device according to some example embodiments, the lower gate structures 120 and 120_1, the first upper semiconductor substrate 200, and the first upper gate structures 220 may be stacked, e.g. sequentially disposed, on the lower semiconductor substrate 100.

Each of the lower gate insulating layer 135 and the upper gate insulating layer 235 may include a high dielectric constant insulating layer. The high dielectric constant insulating layer may include a high dielectric material having a higher dielectric constant than a silicon oxide layer. Each of the lower gate insulating layer 135 and the upper gate insulating layer 235 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Each of the lower gate electrode 130 and the upper gate electrode 230 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Jr), osmium (Os), silver (Ag), gold (Au), zinc (Zn), vanadium (V), or combinations of the same.

The lower gate spacers 140 and the upper gate spacers 240 may include at least one of, for example, silicon nitride (SiN), silicon oxynitride (SiON), silicon oxide (SiO2), or silicon oxycarbonitride (SiOCN).

Each of the lower capping pattern 145 and the upper capping pattern 245 may include at least one of, for example, silicon oxide (SiO2), silicon nitride (SiN), silicon oxynitride (SiON), silicon carbonitride (SiCN), and silicon oxycarbonitride (SiOCN).

Unlike in the drawings, each of the lower gate structures 120 and 120_1 may not include the lower capping pattern 145. Each of the first upper gate structures 220 may not include the upper capping pattern 245.

In FIG. 2, short sides of the first upper gate structures 220, that is, the short sidewalls 230*b* of the upper gate electrodes 230, are illustrated as being aligned in a line along the first direction X. However, this is merely an example used for ease of description, and example embodiments is not limited to this example.

In FIG. 3, the first upper gate structures 220 are not misaligned with the lower gate structures 120. However, this is merely an example used for ease of description, and example embodiments is not limited to this example.

The lower source/drain regions 150 may be disposed on at least one side of the lower gate structures 120 and 120_1. The lower source/drain regions 150 may be disposed between the lower gate structures 120. The lower source/drain regions 150 may be formed on the lower fin patterns 110.

The first upper source/drain regions 250 and 250_1 may be disposed on at least one side of the first upper gate structures 220. The first upper source/drain regions 250 and 250_1 may be formed on the first upper fin patterns 210.

The first upper source/drain regions 250 and 250_1 may include first upper source/drain regions 250 and first cut upper source/drain regions 250_1. The first upper source/drain regions 250 may be disposed between the first upper gate structures 220. The first cut upper source/drain regions 250_1 may be formed at ends of the first upper fin patterns 210. Each of the first cut upper source/drain regions 250_1 may include a cut surface 250_1*s* extending in the thickness direction of the first upper semiconductor substrate 200. The cut surfaces 250_1*s* of the first cut upper source/drain regions 250_1, short sidewalls of the first upper fin patterns 210, and the sidewalls 200*s* of the first upper semiconductor substrate 200 may have a continuous profile.

The first upper gate structures 220 and the first upper source/drain regions 250 and 250_1 may not be disposed on the field region FA (see FIG. 1) of the lower semiconductor substrate 100.

In FIG. 5, the lower source/drain regions 150 are spaced apart from each other, and the first upper source/drain regions 250 are spaced apart from each other. However, this is merely an example used for ease of description, and example embodiments is not limited to this example. Some of the lower source/drain regions 150 may also be connected to each other, and some of the first upper source/drain regions 250 may also be connected to each other.

In FIG. 3, bottom surfaces of the first upper source/drain regions 250 are illustrated as being higher than the first surface 200*a* of the first upper semiconductor substrate 200, but example embodiments is not limited thereto. The bottom surfaces of the first upper source/drain regions 250 may also be located at the same level as the first surface 200*a* of the first upper semiconductor substrate 200, or may be located lower than the first surface 200*a* of the first upper semiconductor substrate 200.

A lower etch stop layer 155 may be formed along an upper surface of the lower semiconductor substrate 100. The lower etch stop layer 155 may be formed along an upper surface of the lower field insulating layer 105 and the profile of the lower source/drain regions 150. The lower etch stop layer 155 may be formed along sidewalls of the lower gate structures 120 and 120_1.

An upper etch stop layer 255 may extend along the first surface 200*a* of the first upper semiconductor substrate 200. The upper etch stop layer 255 may be formed along an upper surface of the upper field insulating layer 205 and the profile of upper surfaces of the first upper source/drain regions 250. The upper etch stop layer 255 may be formed along sidewalls of the first upper gate structures 220.

The upper etch stop layer 255 is not formed on the cut surfaces 250_1*s* of the first cut upper source/drain regions 250_1, the short sidewalls of the first upper fin patterns 210, and the sidewalls 200*s* of the first upper semiconductor substrate 200. The upper etch stop layer 255 may not protrude further than the sidewalls 200*s* of the first upper semiconductor substrate 200 in the first direction X. The upper etch stop layer 255 does not protrude further than the cut surfaces 250_1*s* of the first cut upper source/drain regions 250_1 in the first direction X.

The upper etch stop layer 255 may be disposed on the first active region ACT1 of the lower semiconductor substrate 100. The upper etch stop layer 255 may not be disposed on the field region FA (see FIG. 1) of the lower semiconductor substrate 100.

The lower etch stop layer 155 and the upper etch stop layer 255 may include at least one of, for example, silicon oxide (SiO2), silicon nitride (SiN), silicon oxynitride (SiON), silicon carbonitride (SiCN), and/or silicon oxycarbonitride (SiOCN).

The lower interlayer insulating film 190 may be formed on the lower semiconductor substrate 100. The lower interlayer insulating film 190 may cover the lower gate structures 120 and 120_1 and the lower source/drain regions 150. The lower interlayer insulating film 190 may be formed on the lower etch stop layer 155. The lower interlayer insulating film 190 may include a bonding insulating layer 201 (see FIG. 27) formed to bond the first upper semiconductor substrate 200 and the lower semiconductor substrate 100 during the fabrication process.

The first upper semiconductor substrate 200 may be disposed on the lower interlayer insulating film 190. An upper surface of the lower interlayer insulating film 190 may face the second surface 200*b* of the first upper semiconductor substrate 200.

An upper interlayer insulating film 290 may be formed on the lower interlayer insulating film 190. The upper interlayer insulating film 290 may cover the sidewalls 200*s* of the first upper semiconductor substrate 200. The upper interlayer insulating film 290 may cover the first upper gate structures 220 and the first upper source/drain regions 250 and 250_1.

Each of the lower interlayer insulating film 190 and the upper interlayer insulating film 290 may include, but is not limited to, at least one of silicon oxide, silicon nitride, silicon oxynitride, flowable oxide (FOX), tonen silazen (TOSZ), undoped silica glass (USG), borosilica glass (BSG), phosphosilica glass (PSG), borophosphosilica glass (BPSG), plasma enhanced tetraethylorthosilicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, and/or a porous polymeric material.

At least one of the lower transistors formed on the lower semiconductor substrate 100 may be connected to at least one of the transistors formed on the first upper semiconductor substrate 200. At least one of the first upper gate structures 220 may be connected to at least one of the lower gate structures 120 and 120_1 and/or at least one of the lower source/drain regions 150. At least one of the first upper source/drain regions 250 and 250_1 may be connected to at least one of the lower gate structures 120 and 120_1 or at least one of the lower source/drain regions 150.

In the following description, a case where the first upper gate structure 220 is connected to the lower gate structure 120, and the first upper source/drain region 250 is connected to the lower source/drain region 150 will be described. However, this is merely an example used for ease of description, and example embodiments is not limited to this example.

A lower source/drain contact 170 may contact a lower source/drain region 150. The lower source/drain contact 170 may be formed on the lower source/drain region 150.

A first lower landing pad 171 may be formed on the lower source/drain contact 170. The first lower landing pad 171 may contact the lower source/drain contact 170.

The lower source/drain contact 170 and the first lower landing pad 171 may be formed in the lower interlayer insulating film 190.

A lower gate contact 175 may contact a lower gate electrode 130. The lower gate contact 175 may be formed on the lower gate electrode 130.

A second lower landing pad 176 may be formed on the lower gate contact 175. The second lower landing pad 176 may contact the lower gate contact 175.

The lower gate contact 175 and the second lower landing pad 176 may be formed in the lower interlayer insulating film 190.

Each of the upper gate connection contact 275 and the upper source/drain connection contact 270 may penetrate the first upper semiconductor substrate 200. Each of the upper gate connection contact 275 and the upper source/drain connection contact 270 may be formed at a position where the lower semiconductor substrate 100 and the first upper semiconductor substrate 200 overlap each other.

Each of the upper gate connection contact 275 and the upper source/drain connection contact 270 may be connected to one or more transistors.

The upper source/drain connection contact 270 may penetrate the first upper semiconductor substrate 200 to be directly connected to the first lower landing pad 171. The upper source/drain connection contact 270 may be electrically connected to the lower source/drain contact 170 through the first lower landing pad 171.

The upper source/drain connection contact 270 may be connected to at least one of the first upper source/drain regions 250. Since the upper transistors include the first upper source/drain regions 250, the upper source/drain connection contact 270 may electrically connect an upper transistor and a lower transistor. The upper source/drain connection contact 270 may connect at least one first upper source/drain region 250 to a lower transistor.

The upper source/drain connection contact 270 may be formed in a first connection contact hole 270h. The upper source/drain connection contact 270 may fill the first connection contact hole 270h. For example, the first connection contact hole 270h may be formed in a first upper fin pattern 210, the first upper semiconductor substrate 200, and the lower interlayer insulating film 190.

When the upper source/drain connection contact 270 is formed to be connected to at least two first upper source/drain regions 250, the upper source/drain connection contact 270 may be formed at a position overlapping a first upper fin pattern 210 as illustrated in FIG. 2. Alternatively, unlike in FIG. 2, the upper source/drain connection contact 270 may be formed at a position not overlapping the first upper fin patterns 210 and the first upper gate structures 220.

The upper gate connection contact 275 may penetrate the first upper semiconductor substrate 200 to be directly connected to the second lower landing pad 176. The upper gate connection contact 275 may be electrically connected to the lower gate contact 175 through the second lower landing pad 176.

The upper gate connection contact 275 may be connected to at least one of the upper gate electrodes 230. Since the upper transistors include the upper gate electrodes 230, the upper gate connection contact 275 may electrically connect an upper transistor and a lower transistor. The upper gate connection contact 275 may connect at least one upper gate electrode 230 to a lower transistor.

The upper gate connection contact 275 may be formed in a second connection contact hole 275h. The upper gate connection contact 275 may fill the second connection contact hole 275h. For example, the second connection contact hole 275h may be formed in a first upper gate structure 220, the first upper semiconductor substrate 200, and the lower interlayer insulating film 190.

Each of, or at least one of, the lower gate contact 175, the lower source/drain contact 170, the first lower landing pad 171, the second lower landing pad 176, the upper gate connection contact 275, and the upper source/drain connection contact 270 may include at least one of, for example, tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu), and/or doped polysilicon. Each of, or at least one of, the lower gate contact 175, the lower source/drain contact 170, the first lower landing pad 171, the second lower landing pad 176, the upper gate connection contact 275, and the upper source/drain connection contact 270 may include different materials. Unlike in the drawings, a silicide layer may also be formed between the lower source/drain contact 170 and the lower source/drain region 150.

Unlike in the drawings, a wiring structure connected to the upper gate connection contact 275 and the upper source/drain connection contact 270 may also be formed on the upper gate connection contact 275 and the upper source/drain connection contact 270.

In the drawings, one upper gate connection contact 275 and one upper source/drain connection contact 270 are illustrated. However, this is merely an example used for ease of description, and example embodiments is not limited to this example.

Figure 6:
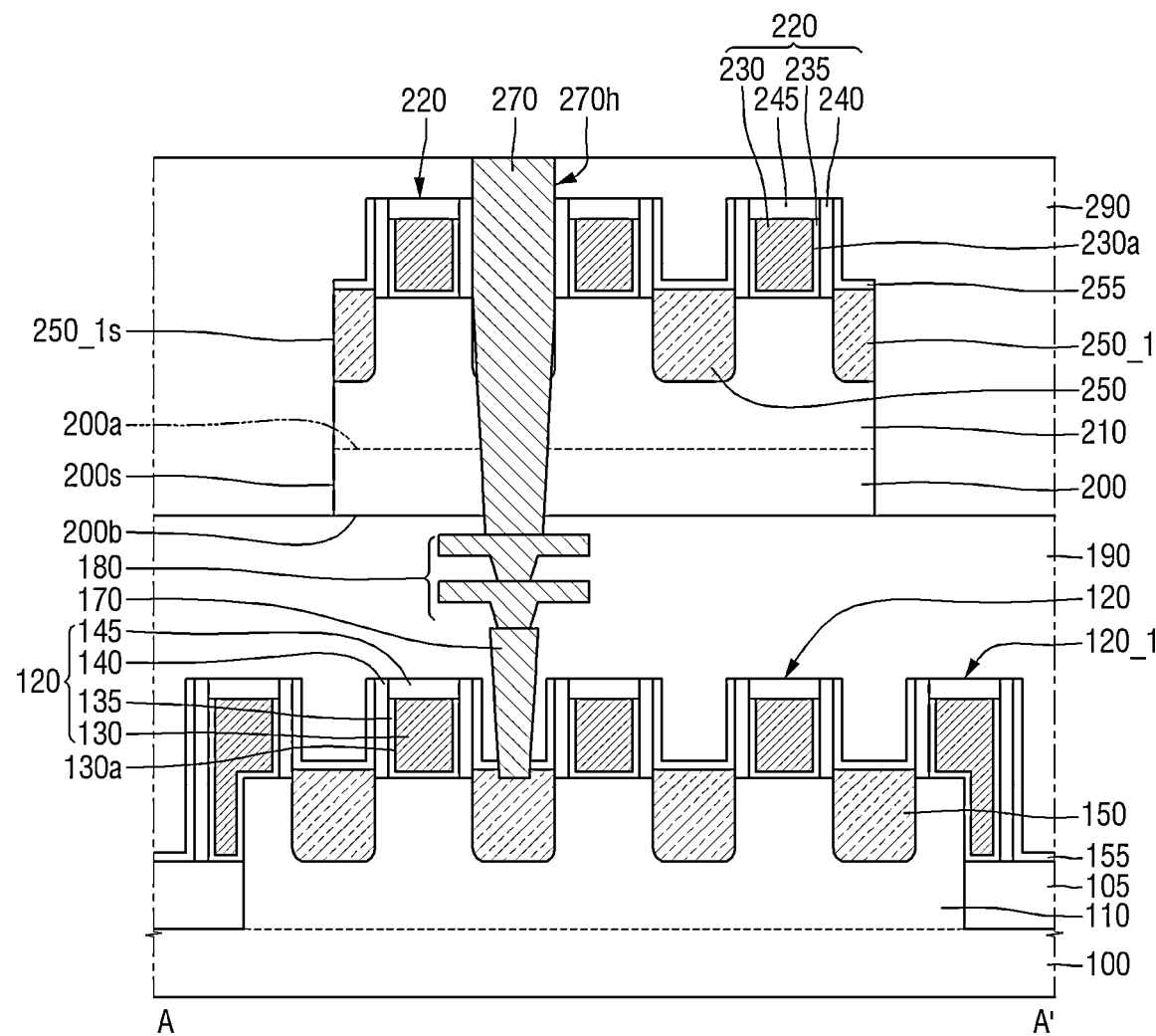
FIGS. 6 and 7 illustrate a semiconductor device according to some example embodiments.
Figure 7:
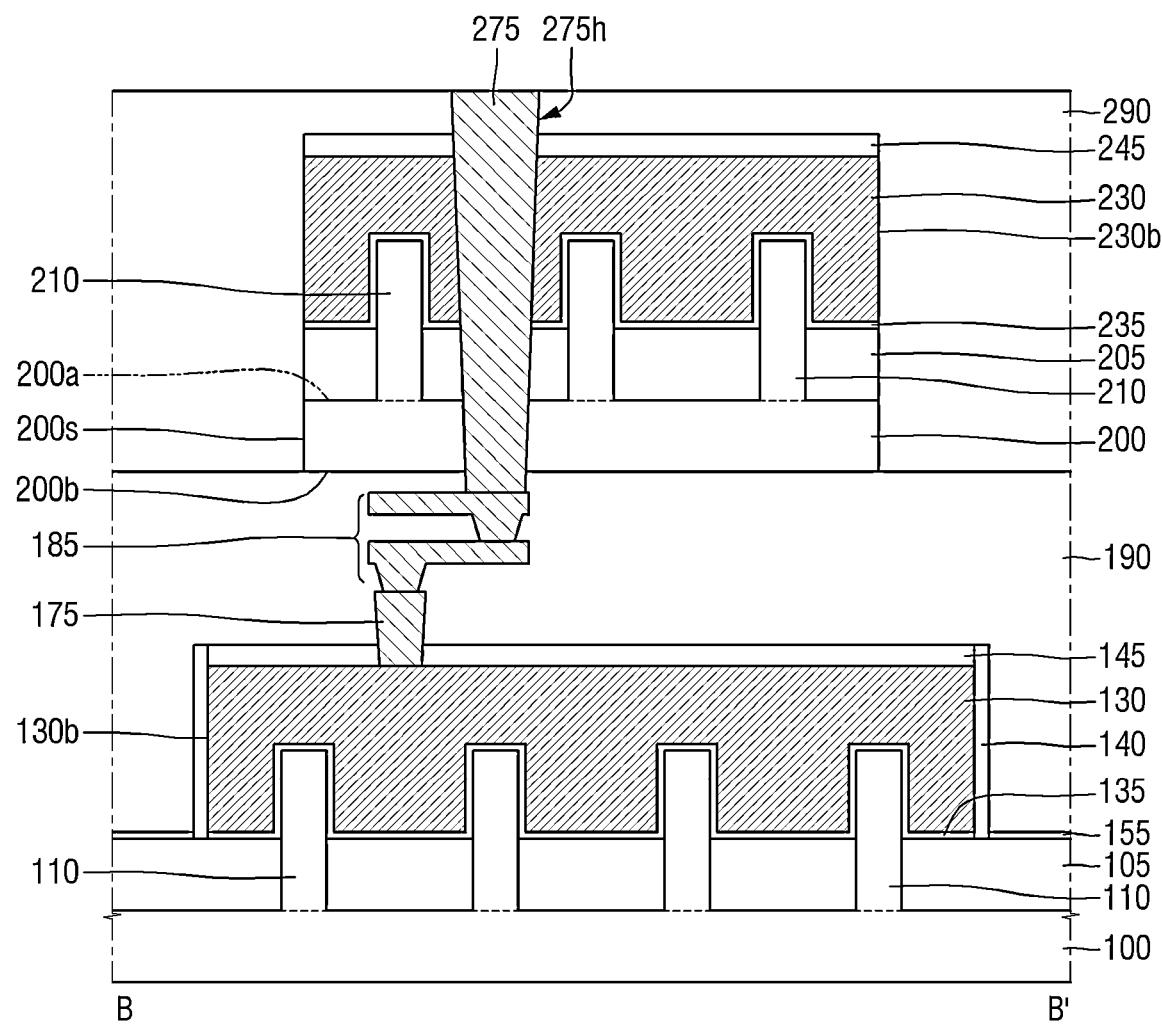

FIGS. 6 and 7 illustrate a semiconductor device according to some example embodiments. For ease of description, the current embodiments will be described, focusing mainly on differences from some example embodiments described above with reference to FIGS. 3 through 5.

Referring to FIGS. 6 and 7, the semiconductor device according to some example embodiments may further include a first wiring structure 180 and a second wiring structure 185 both formed in a lower interlayer insulating film 190.

The first wiring structure 180 and the second wiring structure 185 may be disposed between a lower semiconductor substrate 100 and a first upper semiconductor substrate 200. Each of the first wiring structure 180 and the second wiring structure 185 may include wirings and/or vias formed at a plurality of metal levels.

The first wiring structure 180 may be connected to a lower source/drain contact 170. The first wiring structure 180 may be connected to an upper source/drain connection contact 270.

The first wiring structure 180 may electrically connect the lower source/drain contact 170 and the upper source/drain connection contact 270. The first wiring structure 180 may electrically connect a first upper source/drain region 250 of an upper transistor and a lower source/drain region 150 of a lower transistor.

The second wiring structure 185 may be connected to a lower gate contact 175. The second wiring structure 185 may be connected to an upper gate connection contact 275.

The second wiring structure 185 may electrically connect the lower gate contact 175 and the upper gate connection contact 275. The second wiring structure 185 may electrically connect an upper gate electrode 230 of an upper transistor and a lower gate electrode 130 of a lower transistor.

In the first wiring structure 180 and the second wiring structure 185, wirings and vias formed at the same metal level may be formed at the same time, e.g. through a dual damascene process.

Figure 8:
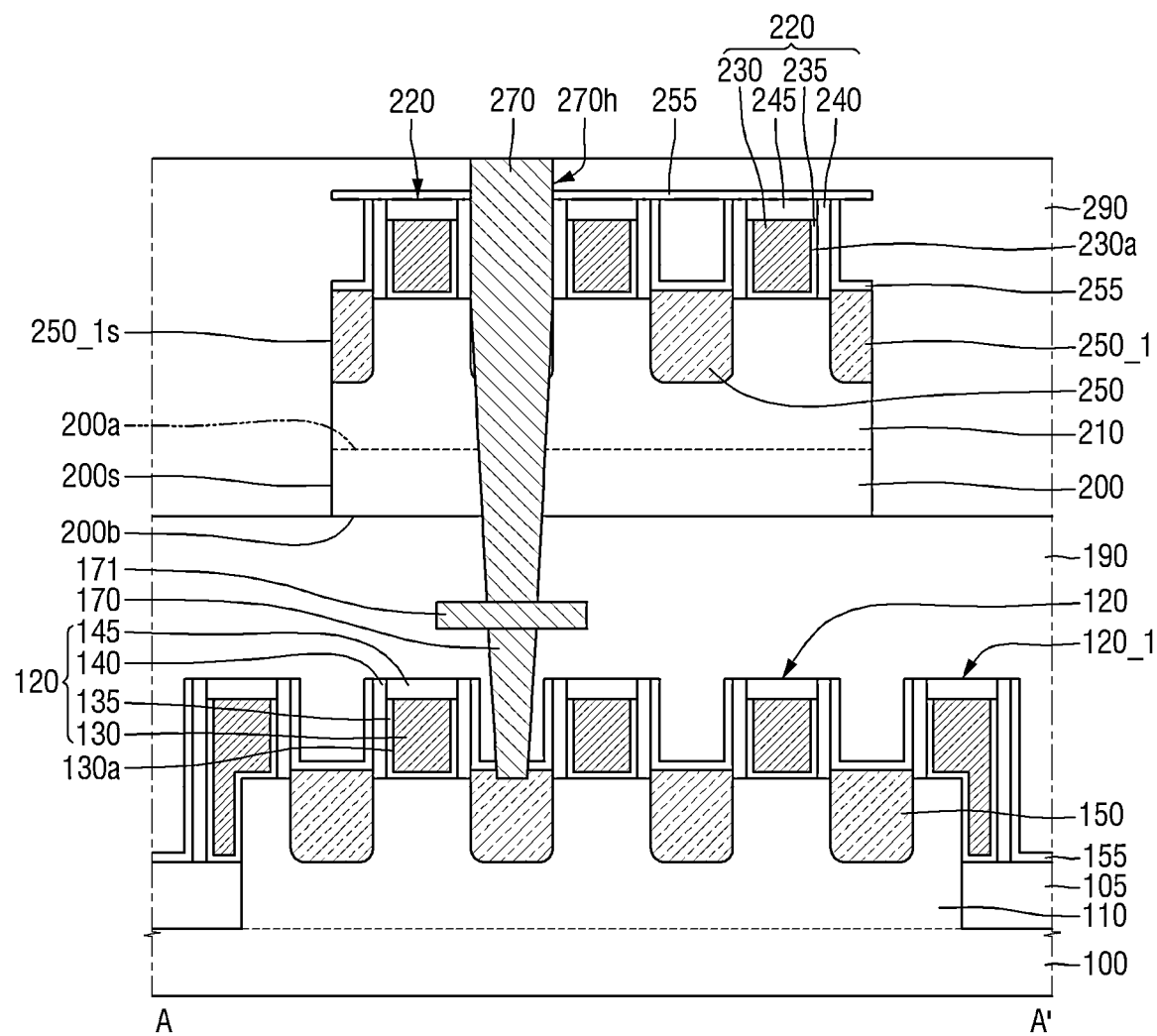
FIGS. 8 and 9 illustrate a semiconductor device according to some example embodiments.
Figure 9:
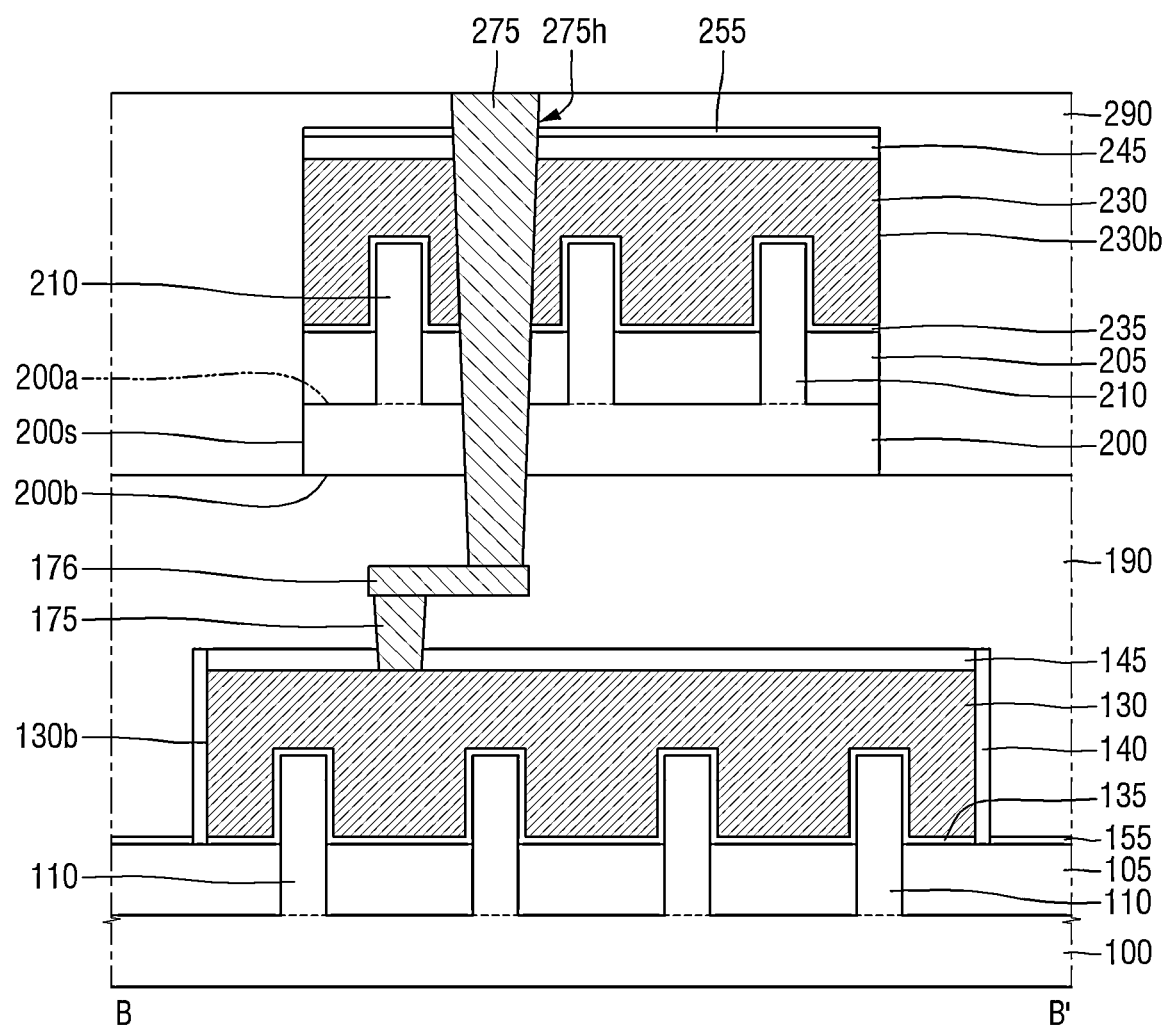

FIGS. 8 and 9 illustrate a semiconductor device according to some example embodiments. For ease of description, the current embodiments will be described, focusing mainly on differences from some example embodiments described above with reference to FIGS. 3 through 5.

Referring to FIGS. 8 and 9, in the semiconductor device according to some example embodiments, an upper etch stop layer 255 may be formed parallel to a second surface 200b of a first upper semiconductor substrate 200.

The upper etch stop layer 255 may extend along upper surfaces of first upper gate structures 220. A portion of an upper interlayer insulating film 290 may be interposed between the upper etch stop layer 255 and each of first upper source/drain regions 250 and 250_1.

Figure 10:
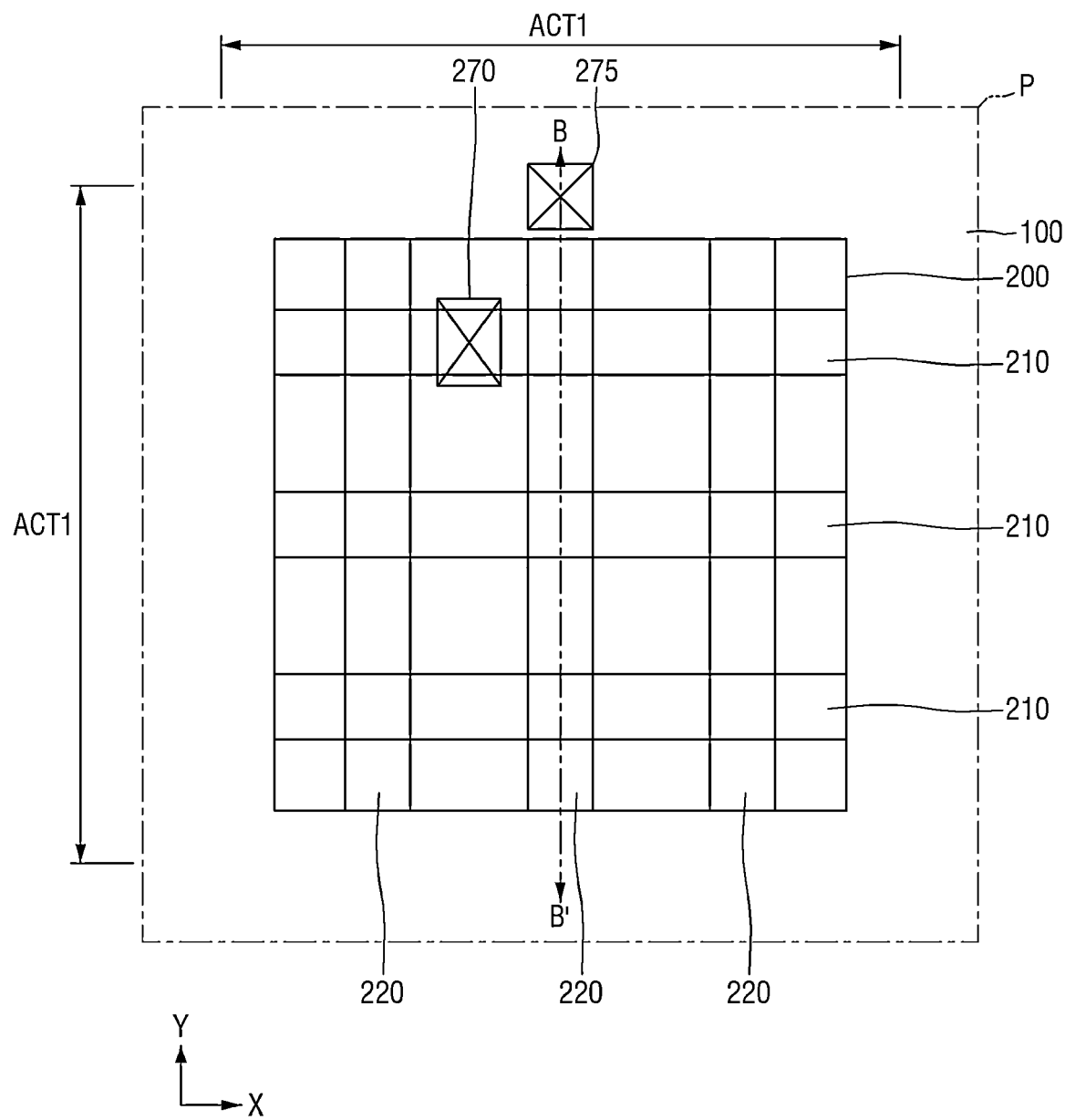
FIG. 10 is a schematic layout view of a semiconductor device according to some example embodiments.
Figure 11:
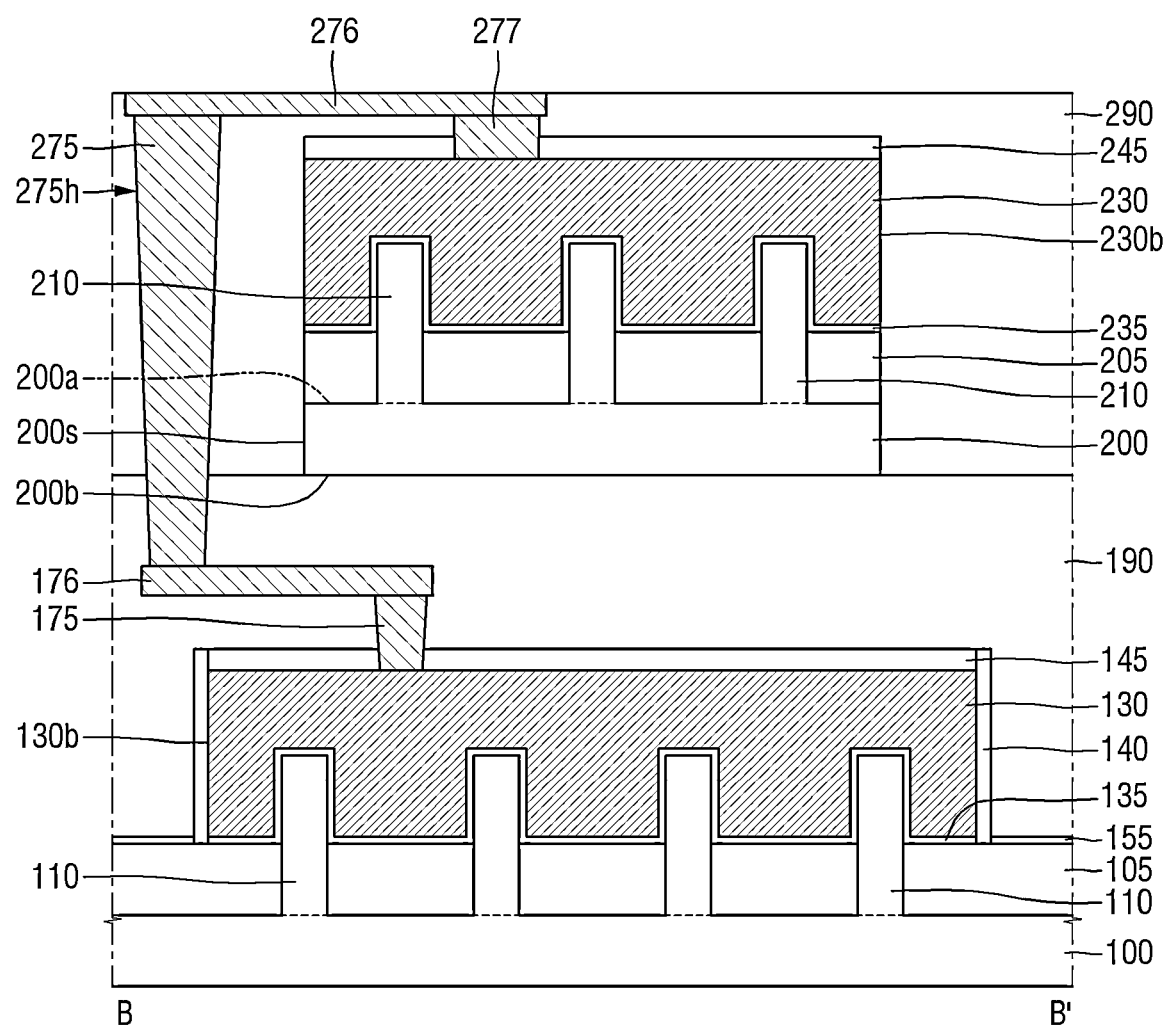
FIG. 11 is a cross-sectional view taken along line B-B' of FIG. 10.

FIG. 10 is a schematic layout view of a semiconductor device according to some example embodiments. FIG. 11 is a cross-sectional view taken along line B-B' of FIG. 10. For ease of description, the current embodiments will be described, focusing mainly on differences from some example embodiments described above with reference to FIGS. 2 through 5.

For reference, FIG. 10 is an enlarged view of the region P of FIG. 1.

Referring to FIGS. 10 and 11, in the semiconductor device according to some example embodiments, an upper gate connection contact 275 may be formed in an upper interlayer insulating film 290 and a lower interlayer insulating film 190. An upper source/drain connection contact 270 may penetrate a first upper semiconductor substrate 200.

The upper gate connection contact 275 does not penetrate the first upper semiconductor substrate 200. The upper gate connection contact 275 may be disposed on an upper surface of a lower semiconductor substrate 100 which is not overlapped by the first upper semiconductor substrate 200. The upper gate connection contact 275 may be formed at a position where the first upper semiconductor substrate 200 and the lower semiconductor substrate 100 do not overlap.

The upper gate connection contact 275 may be electrically connected to an upper gate electrode 230 by an upper connection line 276 and an upper gate contact 277.

Unlike in the drawings, for example, the upper gate connection contact 275 may penetrate the first upper semiconductor substrate 200, and the upper source/drain connection contact 270 may not penetrate the first upper semiconductor substrate 200.

Alternatively, for example, each of the upper gate connection contact 275 and the upper source/drain connection contact 270 may not penetrate the first upper semiconductor substrate 200. The upper gate connection contact 275 and the upper source/drain connection contact 270 may be formed at positions where the first upper semiconductor substrate 200 and the lower semiconductor substrate 100 do not overlap.

Figure 12:
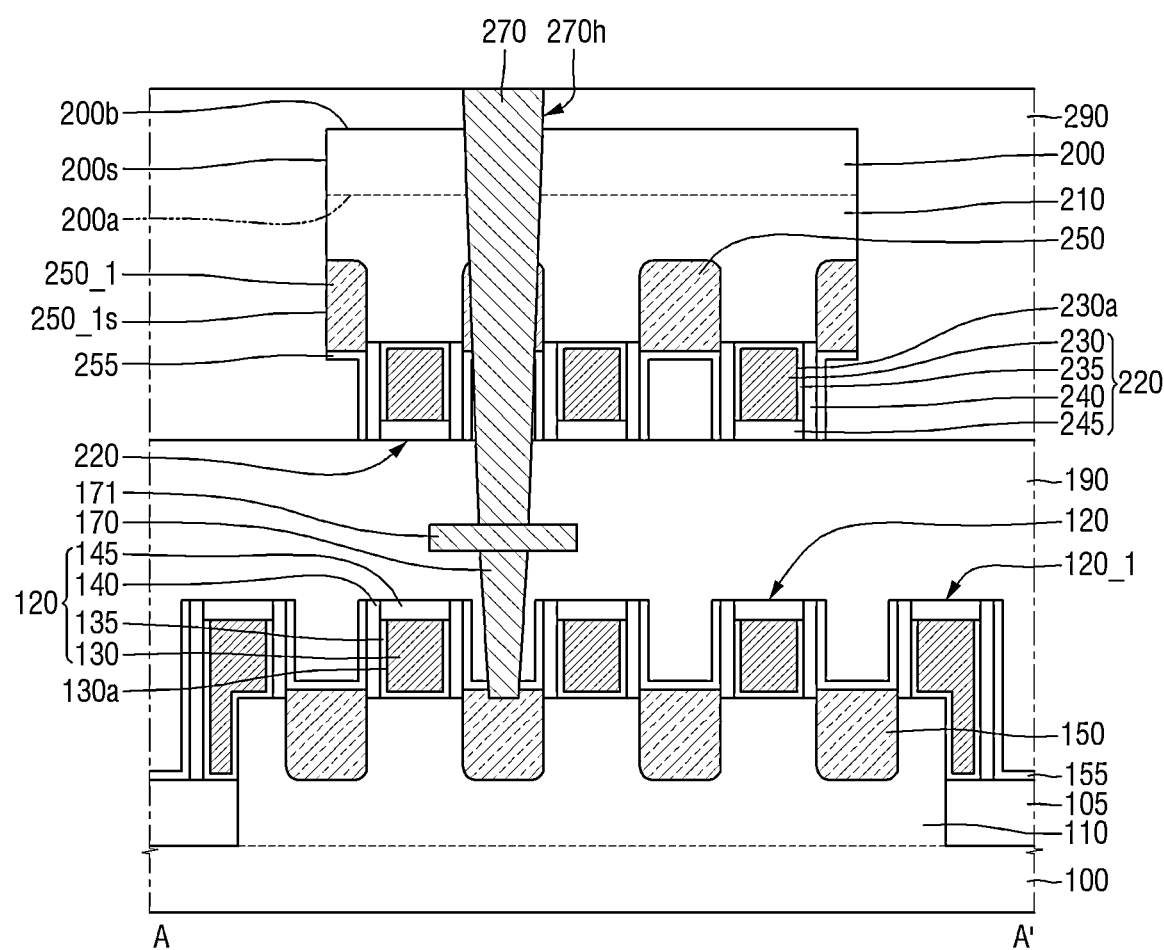
FIGS. 12 through 14 illustrate a semiconductor device according to some example embodiments.
Figure 13:
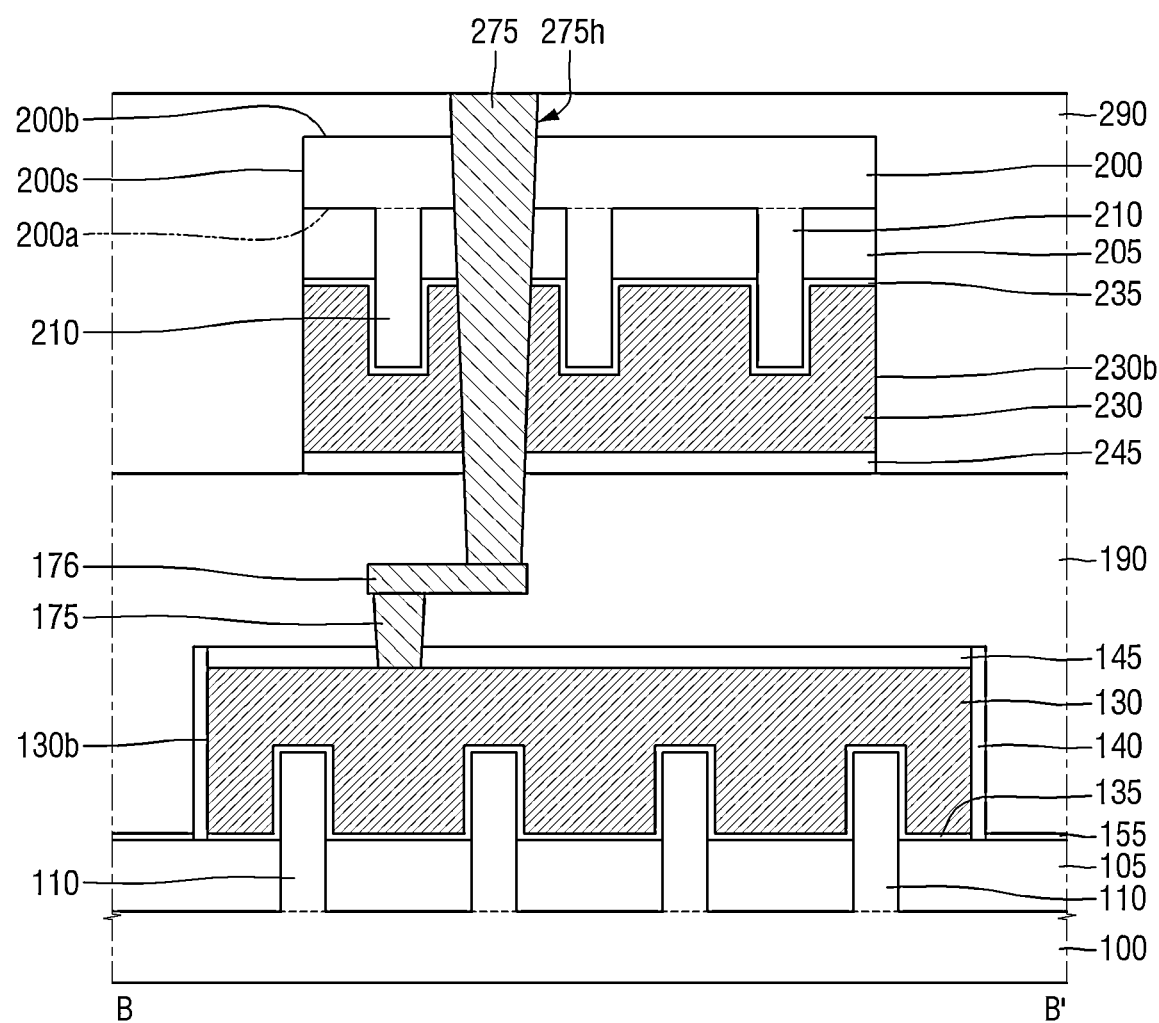
Figure 14:
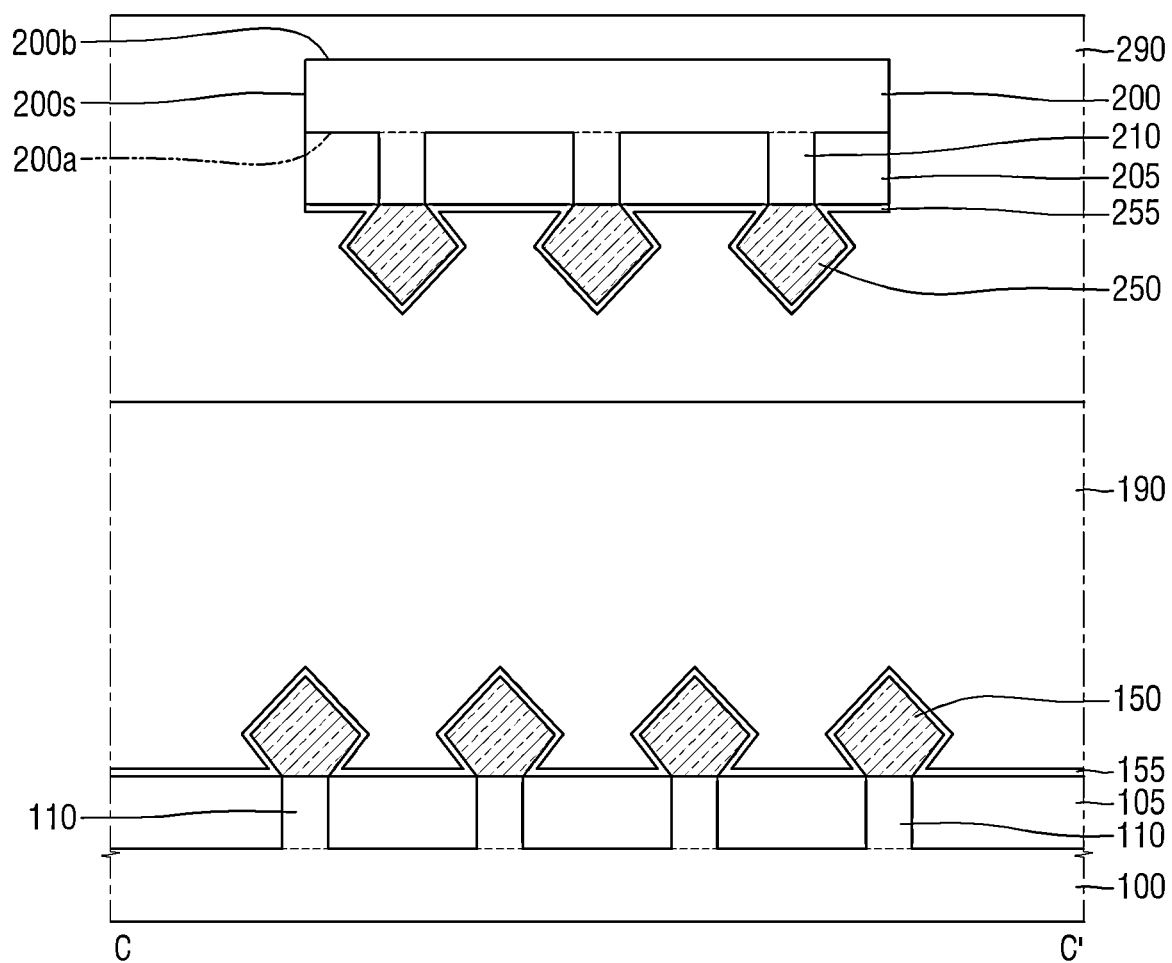

FIGS. 12 through 14 illustrate a semiconductor device according to some example embodiments. For ease of description, the current embodiments will be described, focusing mainly on differences from some example embodiments described above with reference to FIGS. 3 through 5.

Referring to FIGS. 12 through 14, in the semiconductor device according to some example embodiments, lower gate structures 120 and 120_1 and first upper gate structures 220 may be disposed between a lower semiconductor substrate 100 and a first upper semiconductor substrate 200.

Lower source/drain regions 150 and first upper source/drain regions 250 and 250_1 may also be disposed between the lower semiconductor substrate 100 and the first upper semiconductor substrate 200.

For example, a first surface 200a of the first upper semiconductor substrate 200 may face the lower semiconductor substrate 100. First upper fin patterns 210 may protrude from the first upper semiconductor substrate 200 toward the lower semiconductor substrate 100.

An upper source/drain connection contact 270 may sequentially penetrate the first upper semiconductor substrate 200, a first upper fin pattern 210, and a first upper source/drain region 250. Thus, the upper source/drain connection contact 270 may be directly connected to a first lower landing pad 171.

An upper gate connection contact 275 may sequentially penetrate the first upper semiconductor substrate 200, an upper field insulating layer 205, and a first upper gate structure 220. Thus, the upper gate connection contact 275 may be directly connected to a second lower landing pad 176.

In FIG. 12, an insertion insulating layer and an upper etch stop layer 255, which are formed during the fabrication of the first upper gate structures 220, may be disposed on a lower interlayer insulating film 190 between the first upper gate structures 220.

Figure 15:
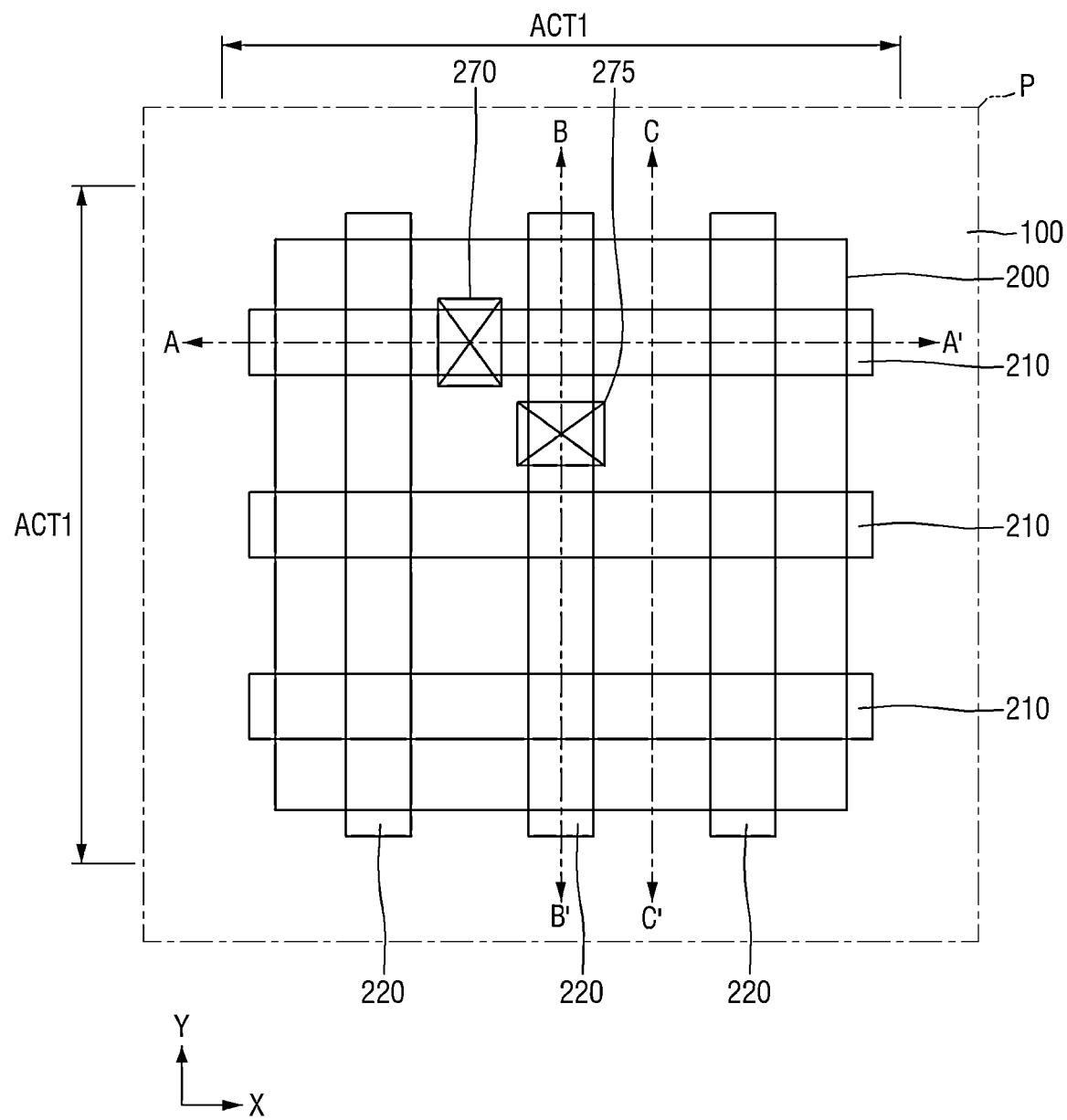
FIG. 15 is a schematic layout view of a semiconductor device according to some example embodiments.
Figure 16:
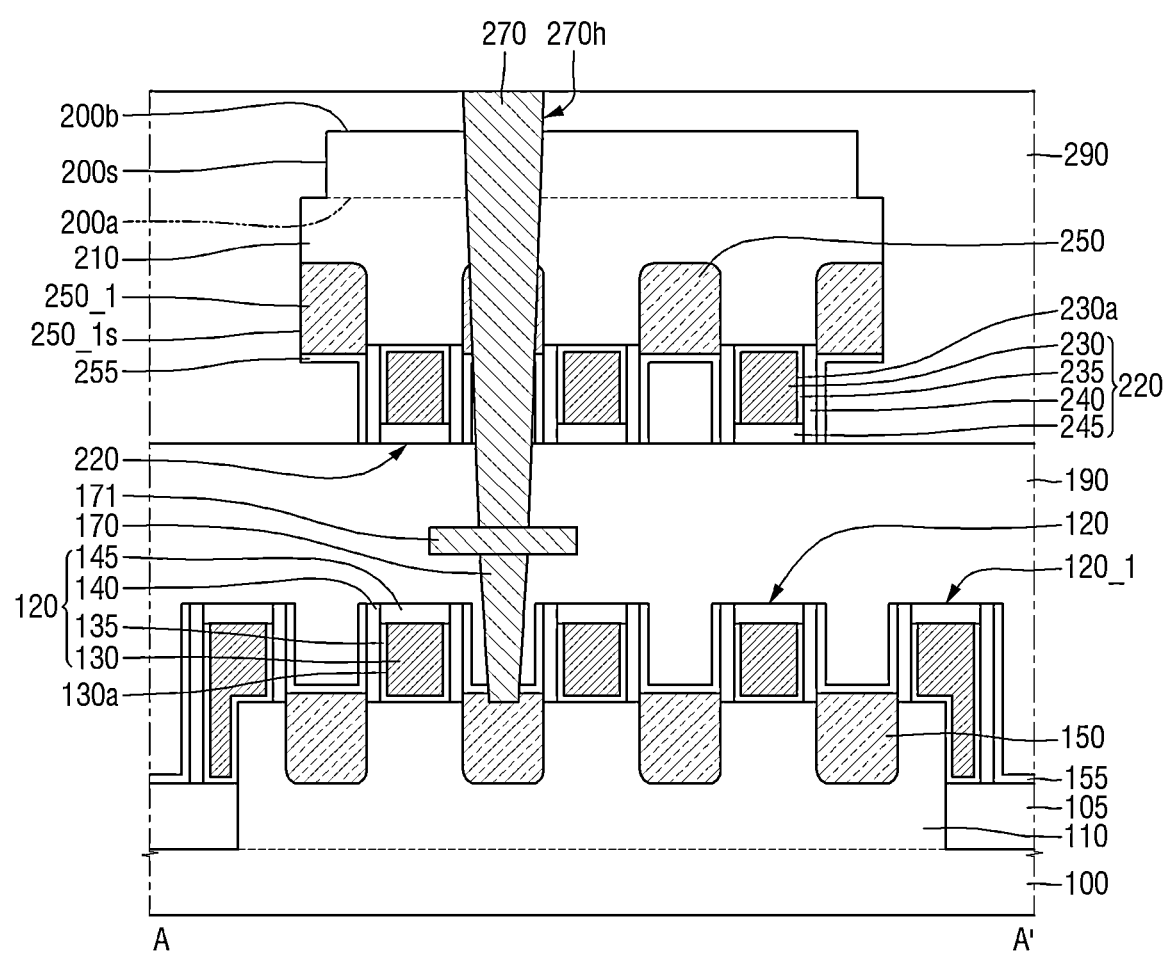
FIG. 16 is a cross-sectional view taken along line A-A' of FIG. 15.
Figure 17:
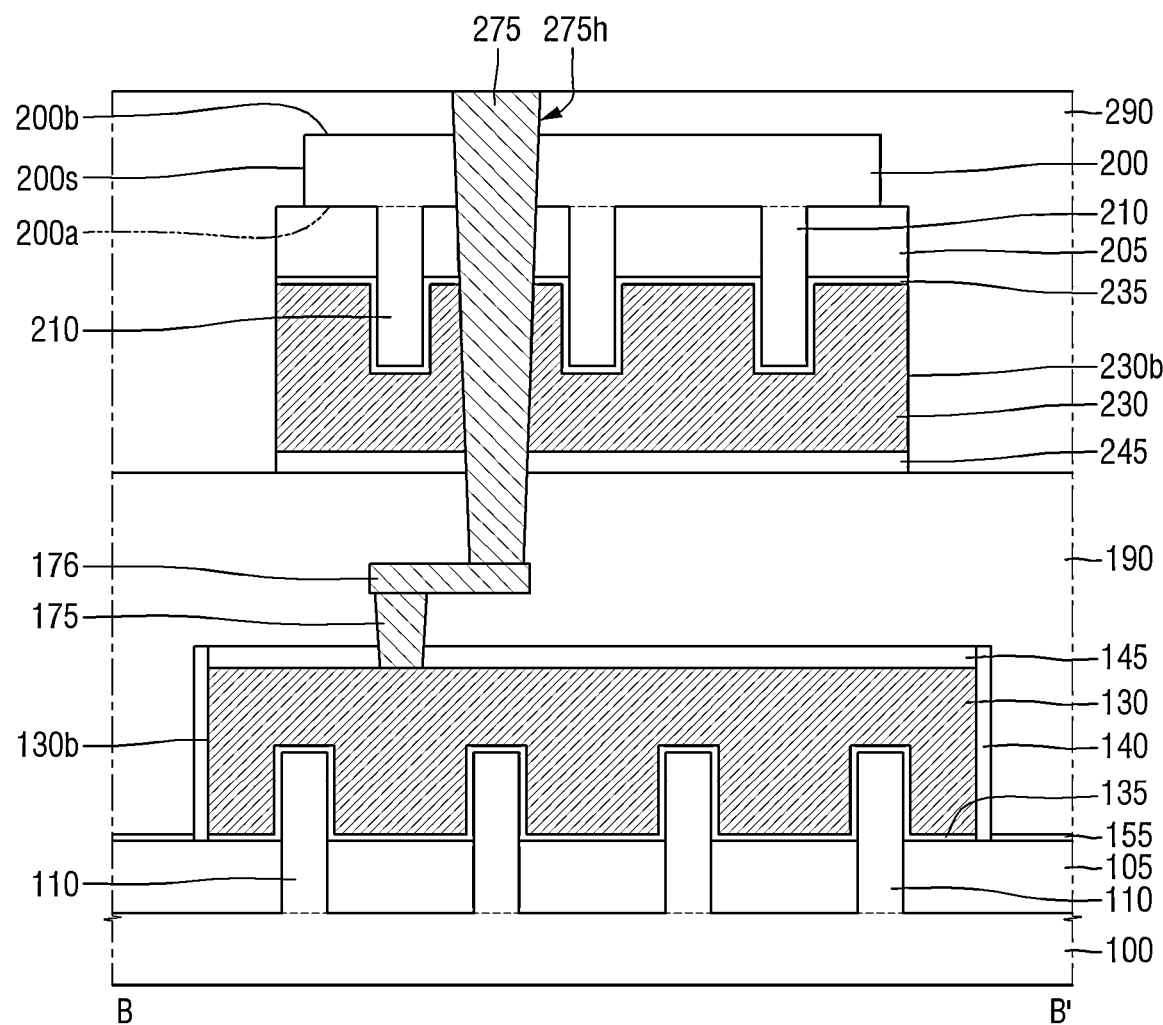
FIG. 17 is a cross-sectional view taken along line B-B' of FIG. 15.
Figure 18:
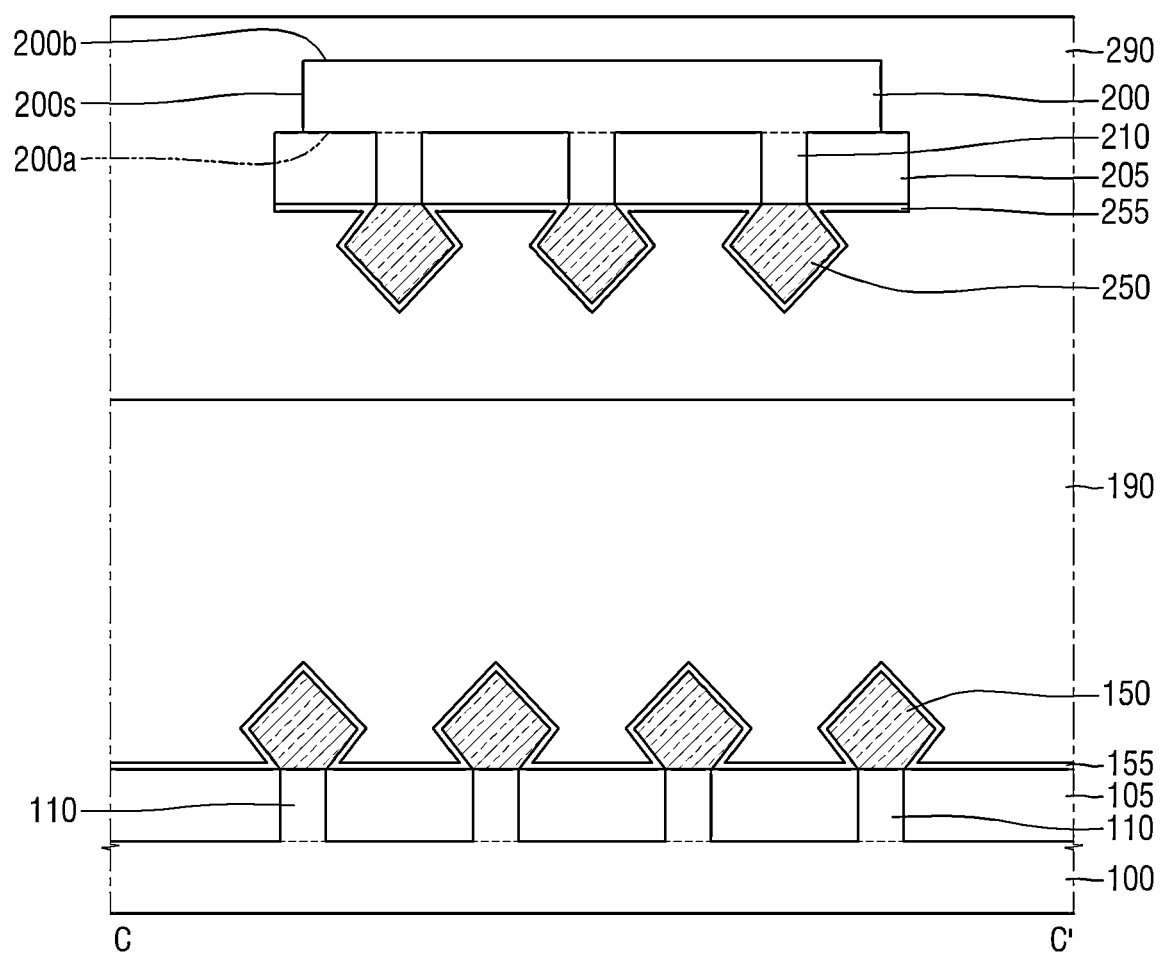
FIG. 18 is a cross-sectional view taken along line C-C' of FIG. 15.

FIG. 15 is a schematic layout view of a semiconductor device according to some example embodiments. FIG. 16 is a cross-sectional view taken along line A-A' of FIG. 15. FIG. 17 is a cross-sectional view taken along line B-B' of FIG. 15. FIG. 18 is a cross-sectional view taken along line C-C' of FIG. 15. For ease of description, the current embodiments will be described, focusing mainly on differences from some example embodiments described above with reference to FIGS. 2 and 12 through 14.

For reference, FIG. 15 is an enlarged view of the region P of FIG. 1.

Referring to FIGS. 15 through 18, in the semiconductor device according to some example embodiments, at least one of a plurality of first upper fin patterns 210 may protrude further than sidewalls 200s of a first upper semiconductor substrate 200 in the first direction X.

At least one of a plurality of first upper gate structures 220 may protrude further than the sidewalls 200s of the first upper semiconductor substrate 200 in the second direction Y.

A portion of each of the first upper fin patterns 210 may protrude further laterally than the sidewalls 200s of the first upper semiconductor substrate 200. A portion of each of the first upper gate structures 220 may protrude further laterally than the sidewalls 200s of the first upper semiconductor substrate 200.

A portion of each of first cut upper source/drain regions 250_1 may protrude further than the sidewalls 200s of the first upper semiconductor substrate 200, like the first upper fin patterns 210 in the first direction X. Here, a portion of an upper etch stop layer 255 may protrude further laterally than the sidewalls 200s of the first upper semiconductor substrate 200.

Unlike in the drawings, the first upper fin patterns 210 may not protrude further than the sidewalls 200s of the first upper semiconductor substrate 200 in the first direction X. Alternatively, the first upper gate structures 220 may not protrude further than the sidewalls 200s of the first upper semiconductor substrate 200 in the second direction Y.

Figure 19:
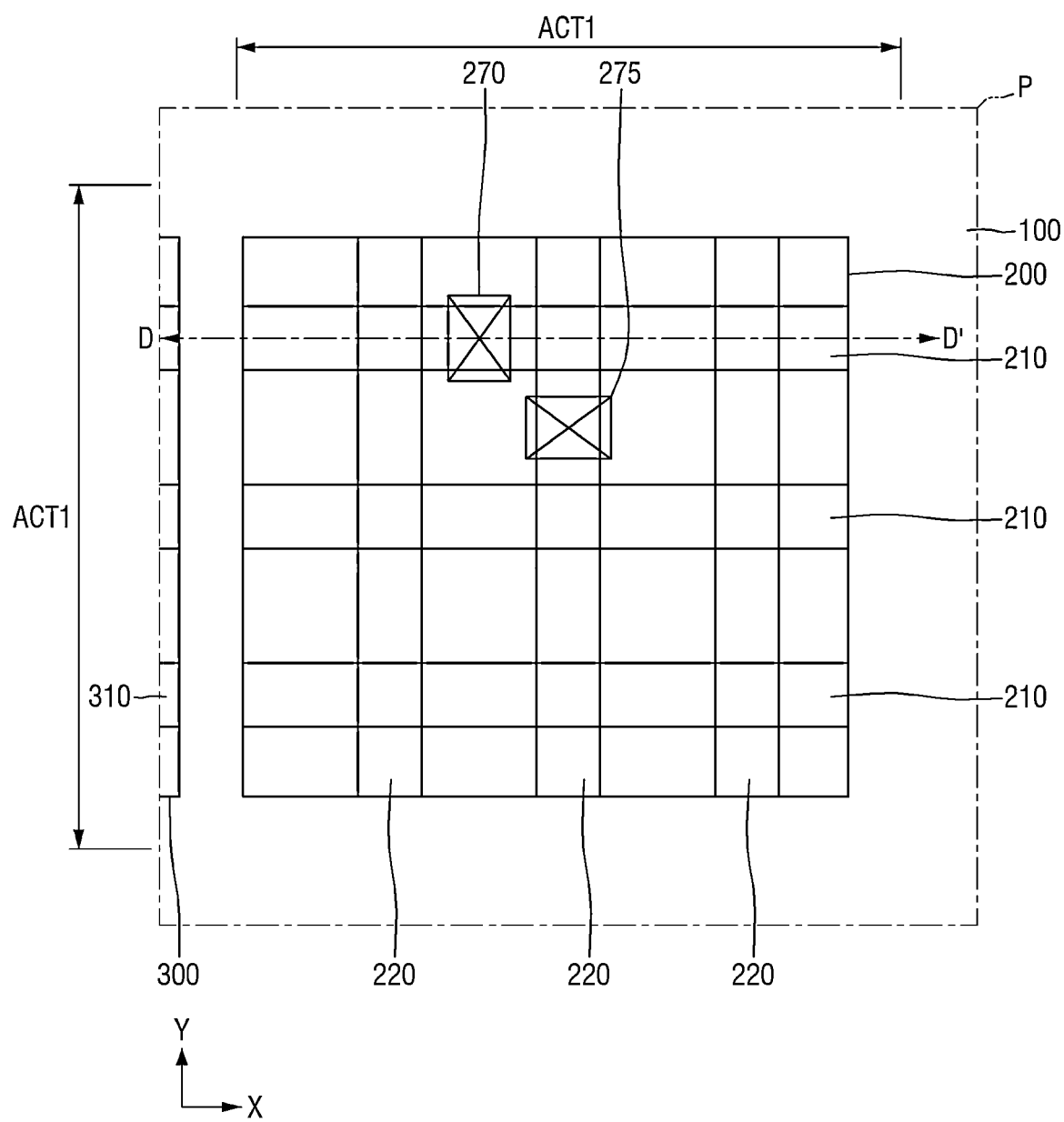
FIG. 19 is a schematic layout view of a semiconductor device according to some example embodiments.
Figure 20:
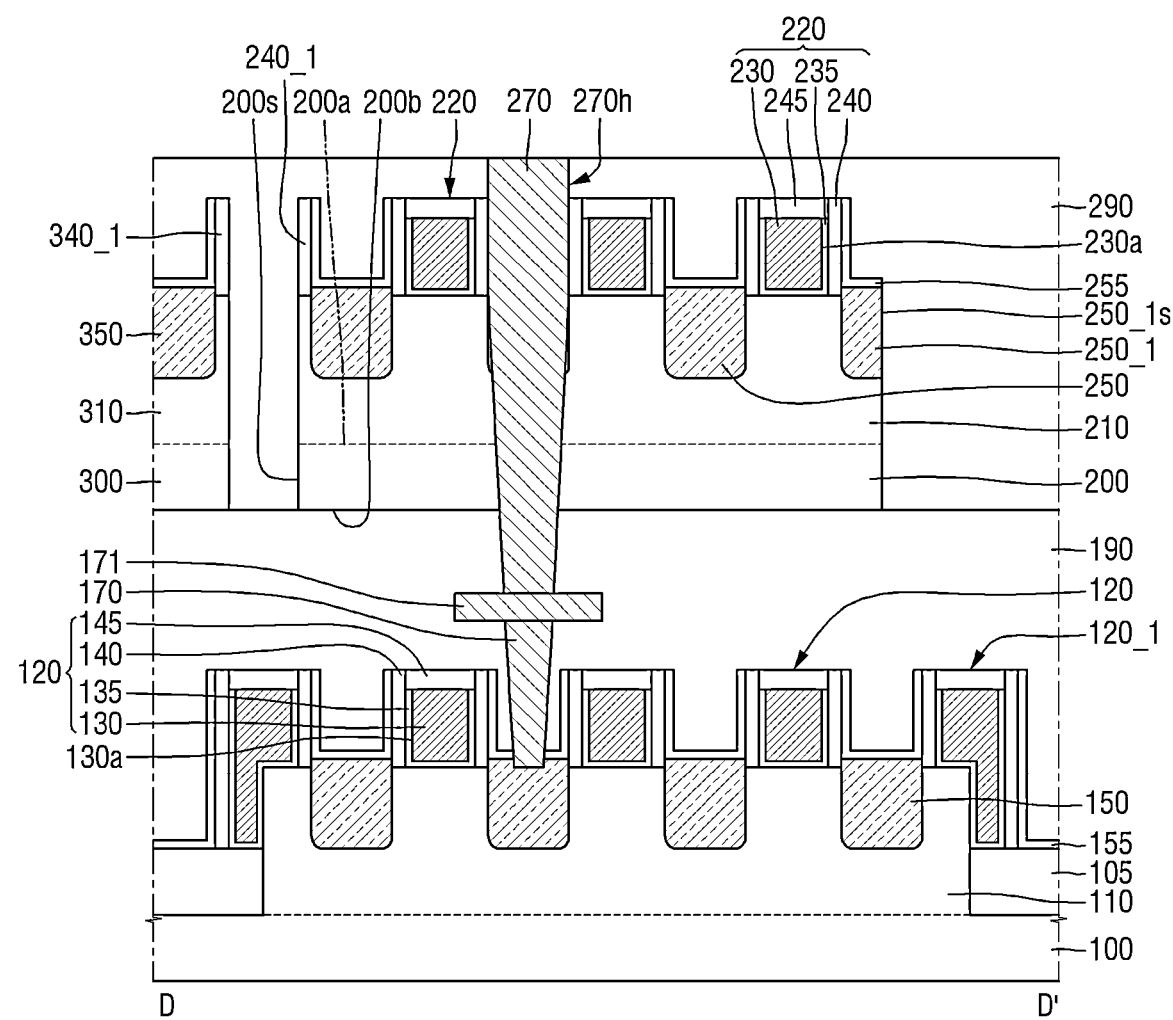
FIG. 20 is a cross-sectional view taken along line D-D' of FIG. 19.

FIG. 19 is a schematic layout view of a semiconductor device according to some example embodiments. FIG. 20 is a cross-sectional view taken along line D-D' of FIG. 19. For ease of description, the current embodiments will be described, focusing mainly on differences from some example embodiments described above with reference to FIGS. 2 through 5.

Referring to FIGS. 19 and 20, in the semiconductor device according to some example embodiments, a first dummy upper spacer 240_1 may be disposed on a first upper semiconductor substrate 200.

The first dummy upper spacer 240_1, a short sidewall of each first upper fin pattern 210, and a sidewall 200s (e.g., a sidewall extending in the second direction Y) of the first upper semiconductor substrate 200 may be aligned in the thickness direction of the first upper semiconductor substrate 200. A first cut upper source/drain regions 250_1 may not be formed on a one side of the first upper semiconductor substrate 200 on which the first dummy upper spacer 240_1 is formed. The first dummy upper spacer 240_1 may be a portion of a first upper gate structure 220.

A second dummy upper spacer 340_1 may be disposed on a second upper semiconductor substrate 300 disposed adjacent to the first side of the first upper semiconductor substrate 200. The second dummy upper spacer 340_1 may be disposed on each second upper fin pattern 310 formed on the second upper semiconductor substrate 300.

The second dummy upper spacer 340_1 may face the first dummy upper spacer 240_1. An upper interlayer insulating film 290 may be disposed between the second dummy upper spacer 340_1 and the first dummy upper spacer 240_1, between the short sidewall of each first upper fin pattern 210 and a short sidewall of each second upper fin pattern 310, and between the first upper semiconductor substrate 200 and the second upper semiconductor substrate 300.

Second upper source/drain regions 350 formed on each second upper fin pattern 310 may be arranged with first upper source/drain regions 250 along the first direction X.

In FIG. 20, the first cut upper source/drain region 250_1 is not formed on the first side of the first upper semiconductor substrate 200 and is formed on the other side of the first upper semiconductor substrate 200. However, example embodiments is not limited thereto. The first cut upper source/drain region 250_1 may also not be formed on the second side of the first upper semiconductor substrate 200. casein example embodiments, the first dummy upper spacer 240_1 may be disposed in the vicinity of the boundary of the second side of the first upper semiconductor substrate 200.

In the fabrication process, the first upper semiconductor substrate 200 and the second upper semiconductor substrate 300 may formed by removing a gate electrode of at least one pre-upper gate structure 220p (see FIG. 25) and an upper semiconductor substrate 200p.

Figure 21:
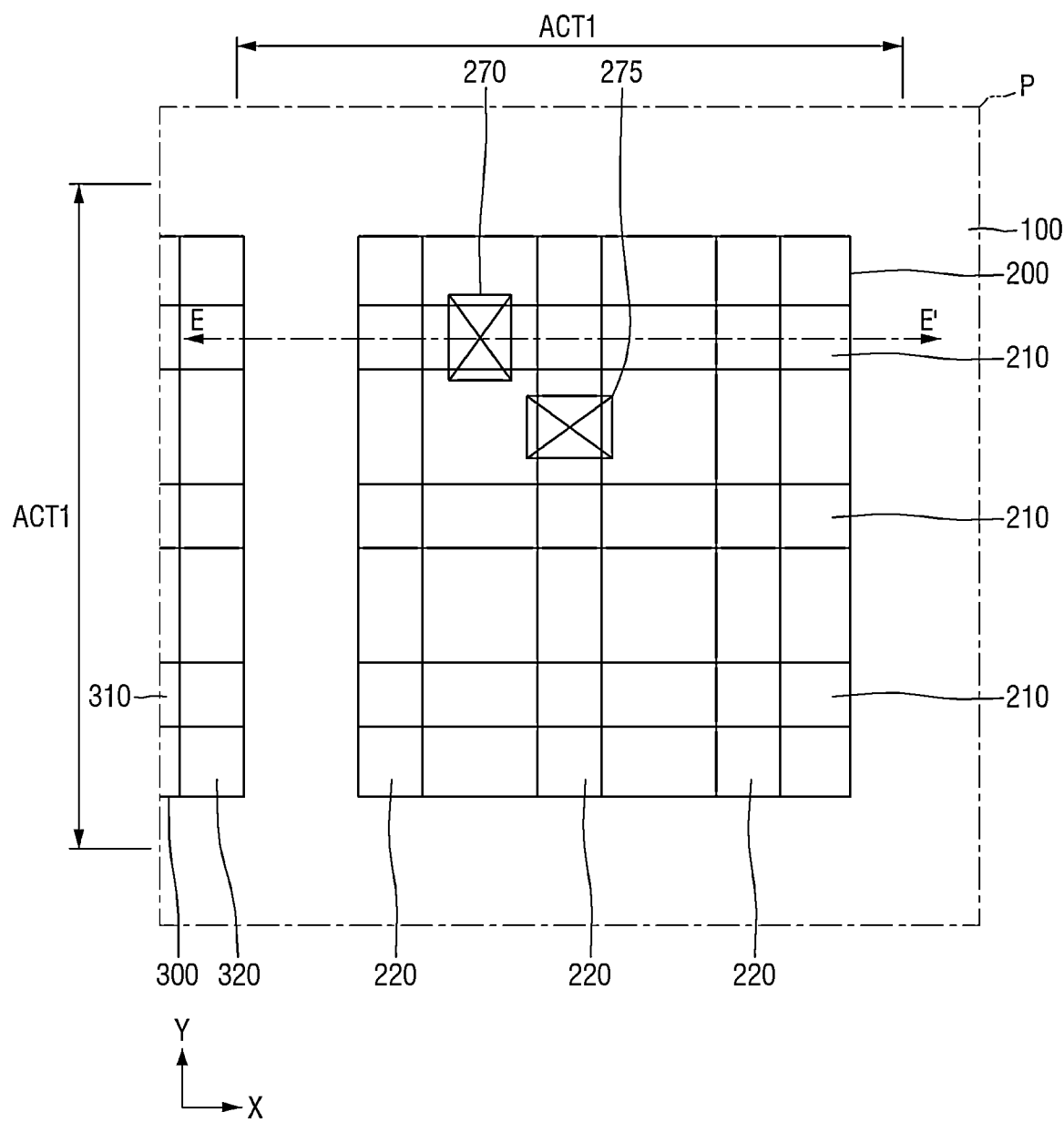
FIG. 21 is a schematic layout view of a semiconductor device according to some example embodiments.
Figure 22:
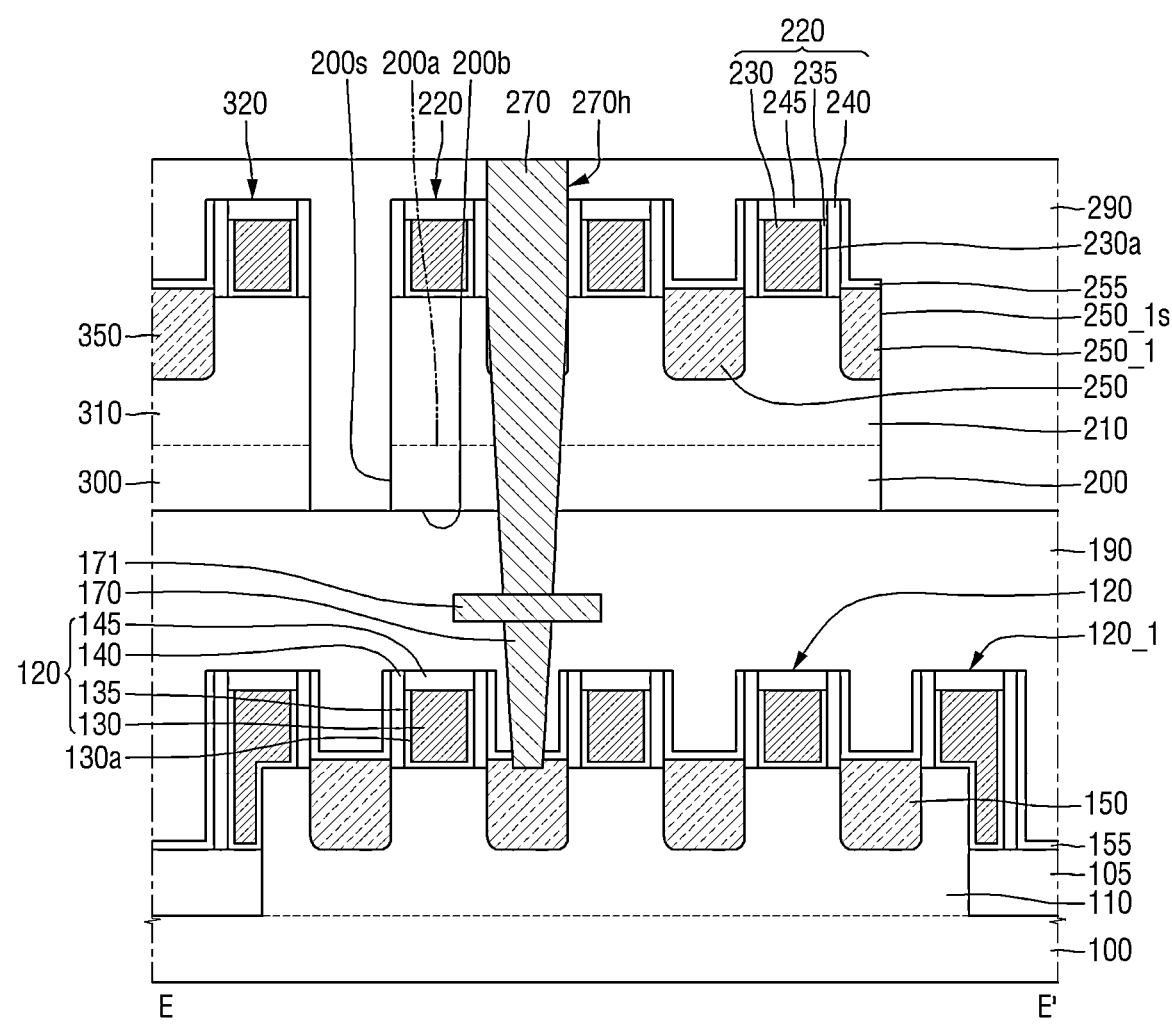
FIG. 22 is a cross-sectional view taken along line E-E' of FIG. 21.

FIG. 21 is a schematic layout view of a semiconductor device according to some example embodiments. FIG. 22 is a cross-sectional view taken along line E-E' of FIG. 21. For ease of description, the current embodiments will be described, focusing mainly on differences from some example embodiments described above with reference to FIGS. 2 through 5.

Referring to FIGS. 21 and 22, in the semiconductor device according to some example embodiments, a sidewall 200s (e.g., a sidewall extending in the second direction Y) of a first upper semiconductor substrate 200, a short sidewall of each first upper fin pattern 210 and a sidewall of a first upper gate structure 220 may be aligned in the thickness direction of the first upper semiconductor substrate 200.

A first cut upper source/drain region 250_1 may not be formed on a side of the first upper semiconductor substrate 200.

A sidewall of a second upper semiconductor substrate 300 disposed adjacent to the side of the first upper semiconductor substrate 200 may be aligned with a sidewall of each second upper fin patterns 310 and a sidewall of a second upper gate structure 320 in the thickness direction of the second upper semiconductor substrate 300.

The second upper gate structure 320 may face the first upper gate structure 220. An upper interlayer insulating film 290 may be disposed between the first upper gate structure 220 and the second upper gate structure 320, between the short sidewall of each first upper fin pattern 210 and the short sidewall of each second upper fin pattern 310, and between the first upper semiconductor substrate 200 and the second upper semiconductor substrate 300.

Second upper source/drain regions 350 formed on each second upper fin pattern 310 may be arranged with first upper source/drain regions 250 along the first direction X.

In the fabrication process, the first upper semiconductor substrate 200 and the second upper semiconductor substrate 300 may be formed by removing pre-upper fin patterns 210p (see FIG. 26) between pre-upper gate structures 220p (see FIG. 25) and an upper semiconductor substrate 200p.

In FIGS. 1 through 22, one first upper semiconductor substrate 200 is stacked on the lower semiconductor substrate 100. However, example embodiments is not limited thereto. For example, a semiconductor substrate including another gate structure may also be stacked on the first upper semiconductor substrate 200.

FIGS. 23 through 30 are views for explaining steps of a method of fabricating a semiconductor device according to some example embodiments.

Figure 23:
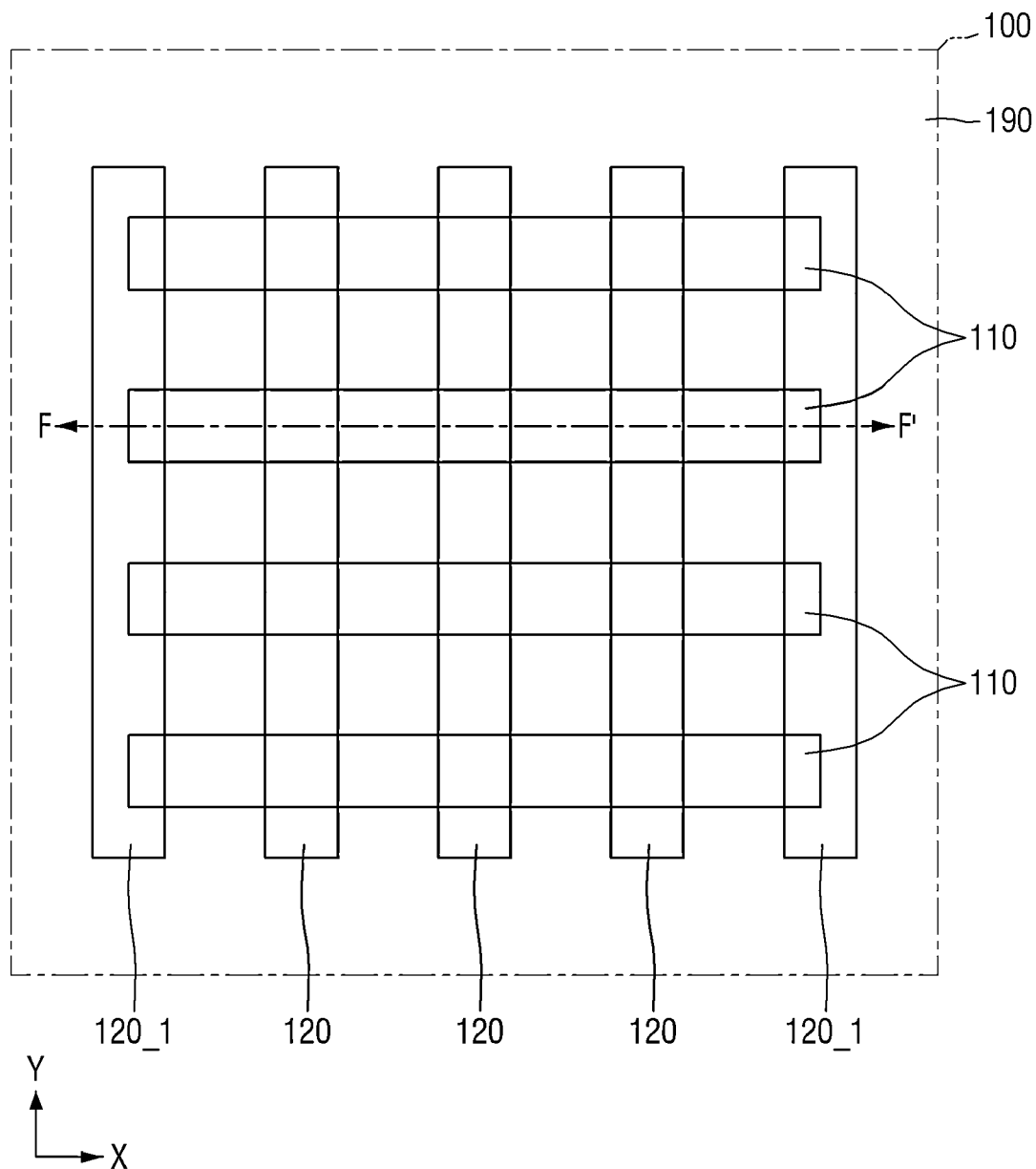
FIGS. 23 through 30 are views for explaining steps of a method of fabricating a semiconductor device according to some example embodiments.
Figure 24:
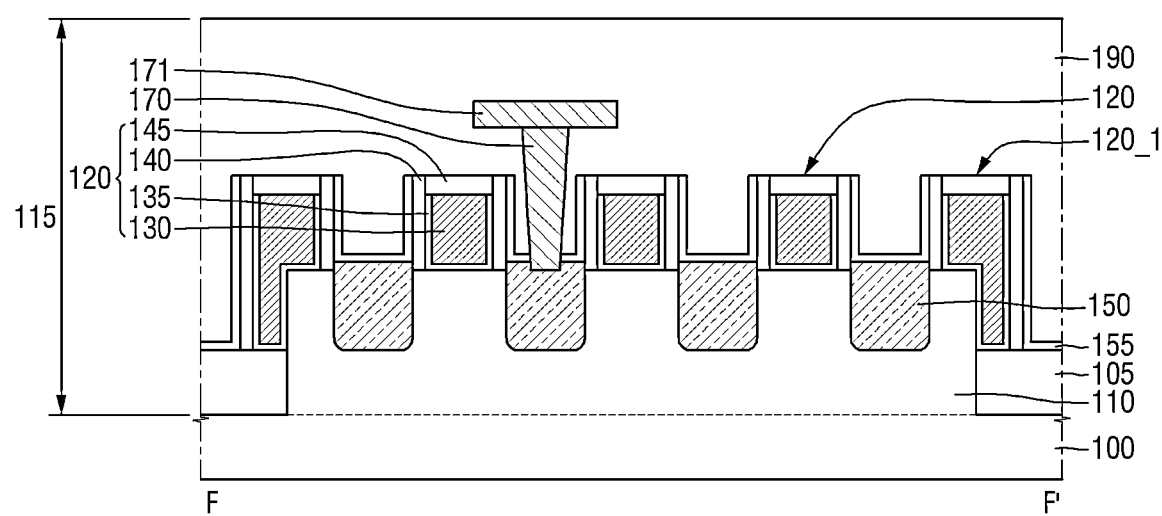
Figure 25:
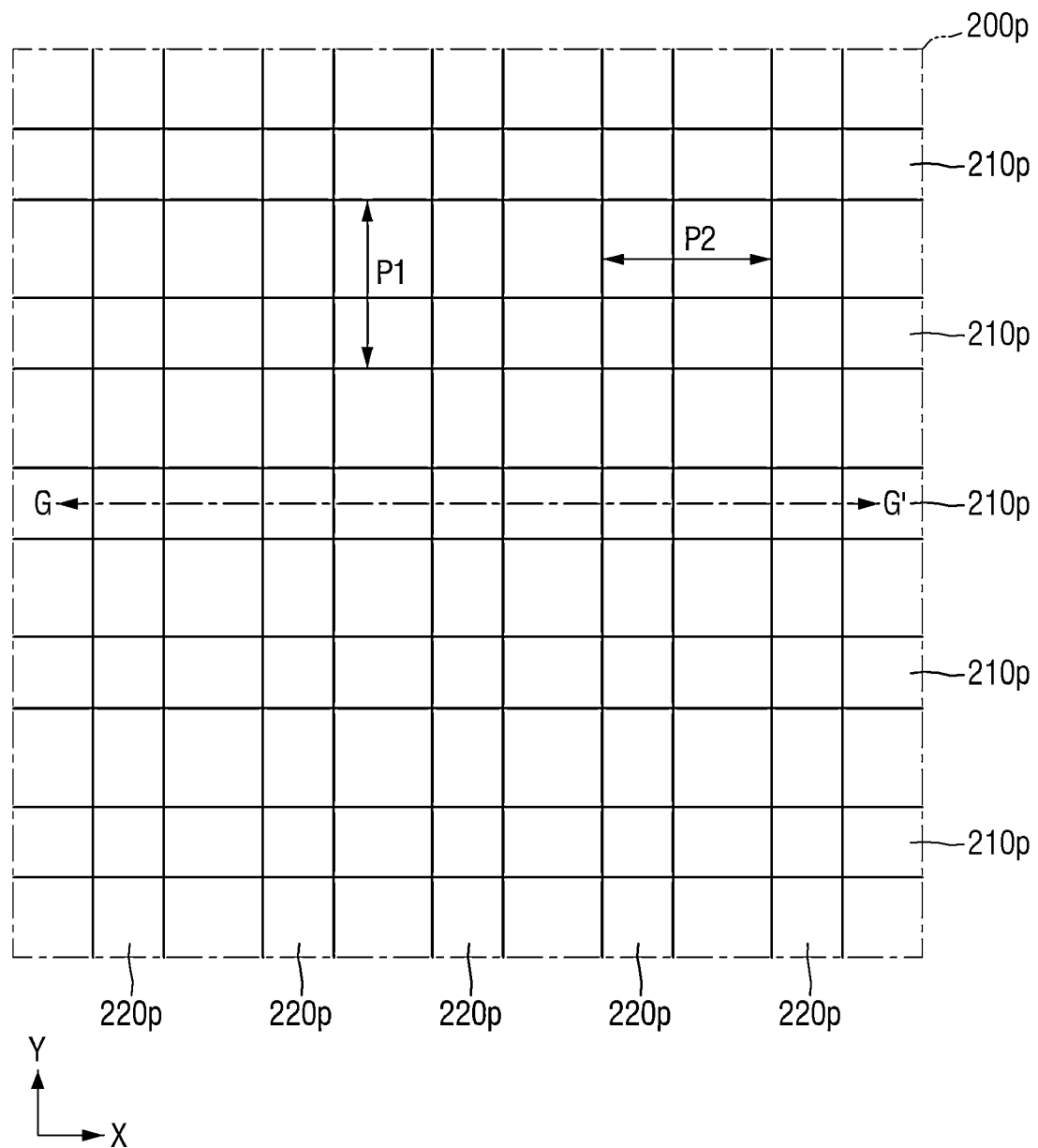
Figure 26:
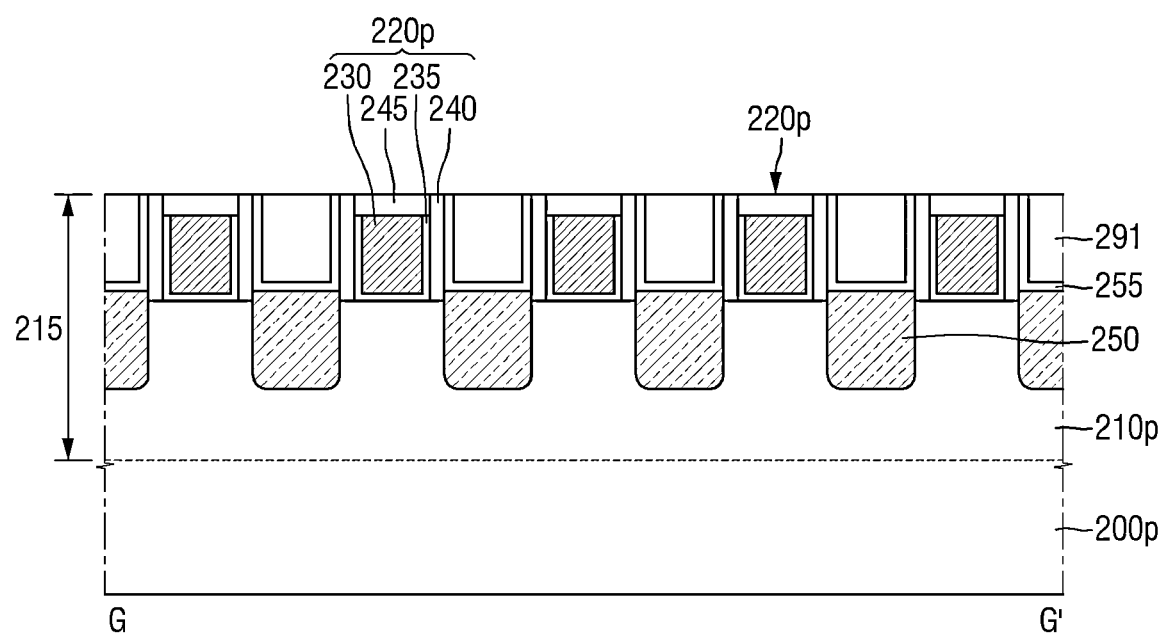

For reference, FIG. 23 may be a layout view of a region of a lower semiconductor substrate 100, more specifically, the first active region ACT1 of FIG. 1. FIG. 24 is a cross-sectional view taken along line F-F' of FIG. 23. FIG. 25 may be a layout view of a region of an upper semiconductor substrate 200p. FIG. 26 is a cross-sectional view taken along line G-G' of FIG. 25. FIG. 30 is a cross-sectional view taken along line H-H' of FIG. 29.

Referring to FIGS. 23 and 24, a plurality of lower transistors may be formed on the lower semiconductor substrate 100.

The lower transistors may include a plurality of lower fin patterns 110, a plurality of lower gate structures 120 and 120_1, and a plurality of lower source/drain regions 150. The lower transistors may be formed at positions where the lower fin patterns 110 and the lower gate structures 120 intersect, respectively.

The lower fin patterns 110 may extend in the first direction X. The lower gate structures 120 and 120_1 may extend in the second direction Y.

A lower interlayer insulating film 190 may be formed on the lower semiconductor substrate 100 to cover the lower gate structures 120 and 120_1 and the lower source/drain regions 150.

A lower source/drain contact 170 and a first lower landing pad 171 connected to a lower source/drain region 150 may be formed in the lower interlayer insulating film 190.

The lower interlayer insulating film 190 may be formed not by one process, but by a plurality of processes. For example, after a portion of the lower interlayer insulating film 190 is formed, the lower source/drain contact 170 and the first lower landing pad 171 may be formed. Then, the rest of the lower interlayer insulating film 190 may be formed.

The lower transistors, the lower source/drain contact 170, and the first lower landing pad 171 may be formed in a lower element region 115 on the lower semiconductor substrate 100.

Referring to FIGS. 25 and 26, a plurality of upper transistors may be formed on the upper semiconductor substrate 200p.

The upper transistors may include a plurality of pre-upper fin patterns 210p, a plurality of pre-upper gate structures 220p, and a plurality of first upper source/drain regions 250. The upper transistors may be formed at positions where the pre-upper fin patterns 210p and the pre-upper gate structures 220p intersect, respectively.

On the upper semiconductor substrate 200p, the pre-upper fin patterns 210p may extend in the first direction X. The pre-upper gate structures 220p may extend in the second direction Y.

Either or both of the pre-upper fin patterns 210p and the pre-upper gate structures 220p may be regularly arranged on the upper semiconductor substrate 200p. For example, the pre-upper fin patterns 210p may be arranged with a constant pitch P1 in the Y direction and/or the pre-upper gate structures 220p may be arranged with constant pitch P2 in the X direction. The constant pitch P1 in the Y direction may be the same as, or different from, the constant pitch P2 in the X direction.

A pre-upper interlayer insulating film 291 may be formed on the upper semiconductor substrate 200p.

The upper transistors may be formed in an upper element region 215 on the upper semiconductor substrate 200p.

Figure 27:
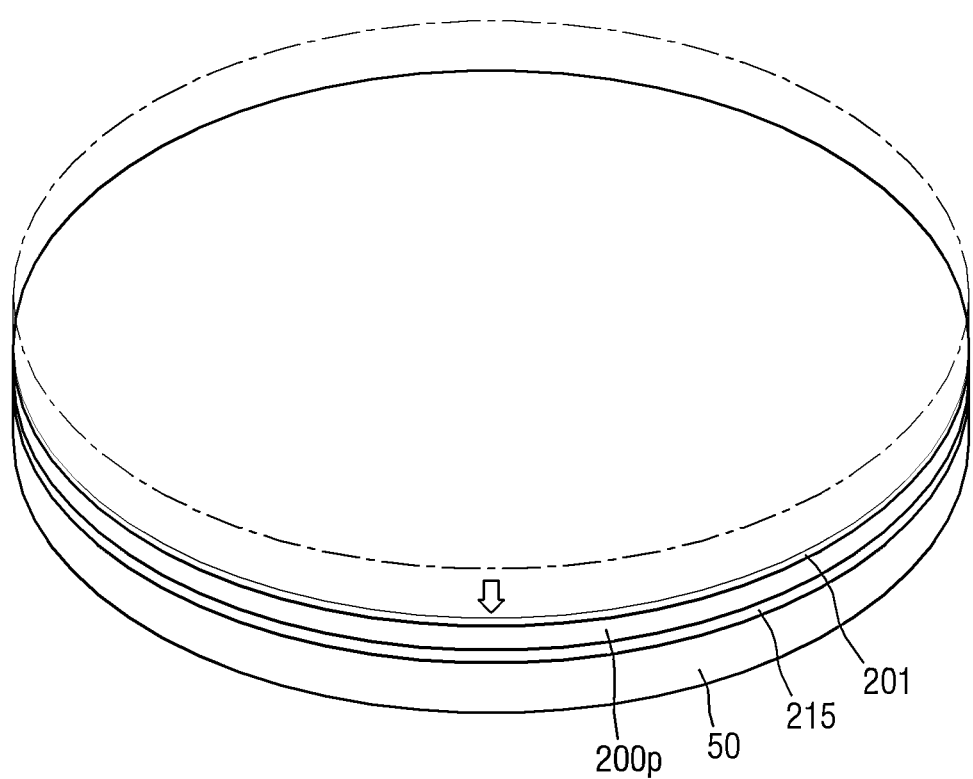

Referring to FIG. 27, the upper semiconductor substrate 200p may be bonded to a support substrate 50.

The upper element region 215 may be placed between the upper semiconductor substrate 200p and the support substrate 50.

Then, at least a portion of the upper semiconductor substrate 200p may be removed to reduce the thickness of the upper semiconductor substrate 200p.

For example, the upper semiconductor substrate 200p may be partially removed to leave a portion of the upper semiconductor substrate 200p under the upper element region 215. Alternatively, the entire upper semiconductor substrate 200p excluding the upper element region 215 may be removed.

After the thickness of the upper semiconductor substrate 200p is reduced, a bonding insulating layer 201 may be formed on a surface of the upper semiconductor substrate 200p.

If the upper semiconductor substrate 200p is or includes an SOI substrate, and a buried insulating layer of the SOI substrate is exposed during the partial removal of the upper semiconductor substrate 200p, the bonding insulating layer 201 may not be formed.

Figure 28:
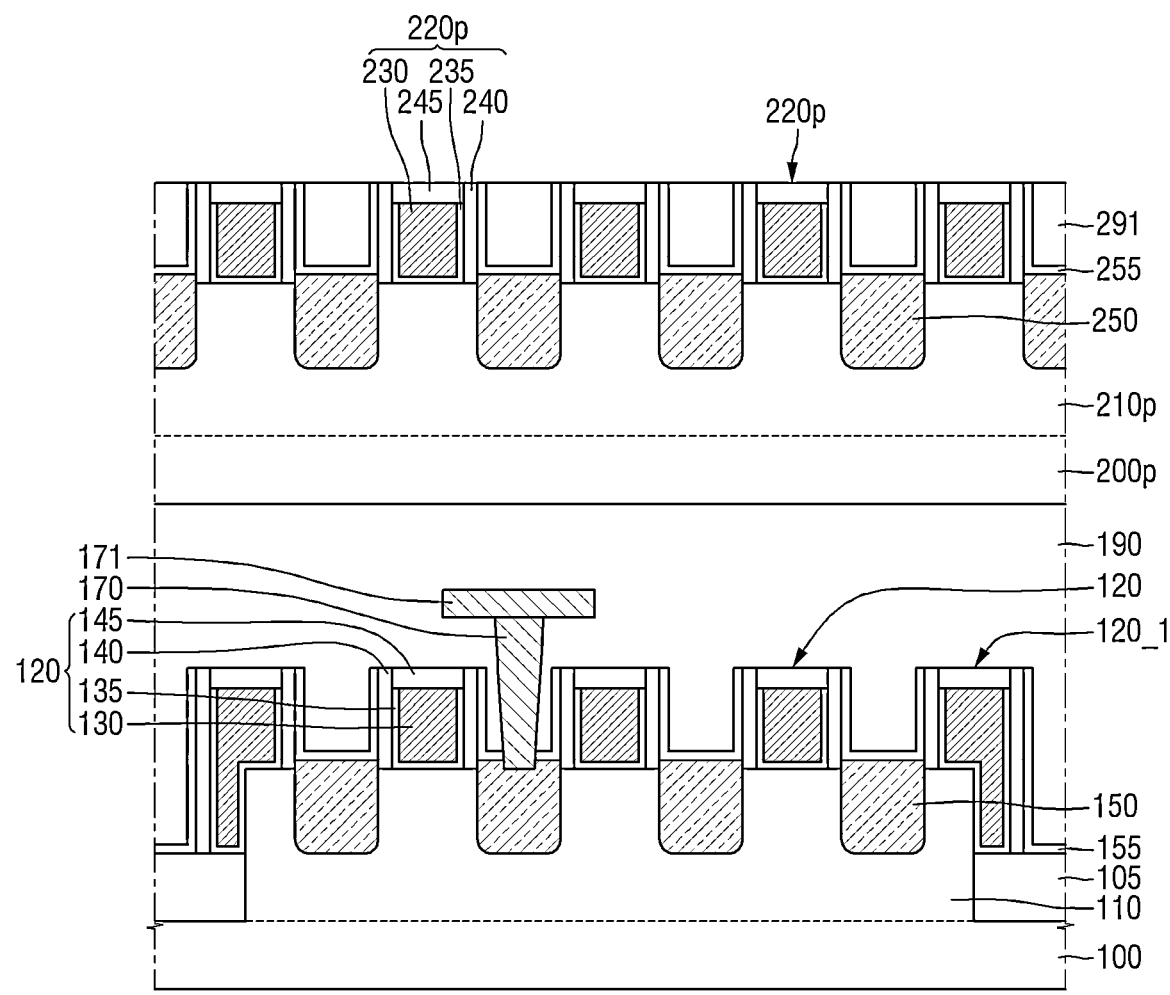

Referring to FIG. 28, the lower semiconductor substrate 100 and the upper semiconductor substrate 200p may be bonded together.

The upper semiconductor substrate 200p and the lower semiconductor substrate 100 may be bonded using the bonding insulating layer 201 (see FIG. 27). The bonding insulating layer 201 becomes a part of the lower interlayer insulating film 190.

The bonding of the upper semiconductor substrate 200p and the lower semiconductor substrate 100 may cause misalignment of the pre-upper gate structures 220p and the lower gate structures 120 and 120_1. However, since the pre-upper fin patterns 210p and the pre-upper gate structures 220p are formed regularly, e.g. as an array having a constant pitch, on the upper semiconductor substrate 200p, the magnitude of misalignment between the pre-upper gate structures 220p and the lower gate structures 120, 120_1 may not be large.

For example, the magnitude of the misalignment may be less than half the distance between corresponding sidewalls of adjacent lower gate structures 120 and 120_1. Alternatively, the magnitude of the misalignment may be less than half the distance between corresponding sidewalls of adjacent pre-upper gate structures 220p. For example, if the pre-upper gate structures 220p are formed with a constant pitch, then the misalignment between the pre-upper gate structures 220p and the lower gate structures 120, 120_1 may be as small as a contact to poly (CPP) pitch of the pre-upper gate structures 220p.

A first gate structure and a second gate structure may be adjacent to each other. Here, the first gate structure may include a one sidewall and the other sidewall, and the second gate structure may include a one sidewall and the other sidewall. If one source/drain region is formed between the first sidewall of the first gate structure and the second sidewall of the second gate structure which face each other, the one sidewall of the first gate structure and the one sidewall of the second gate structure may be corresponding sidewalls.

Figure 29:
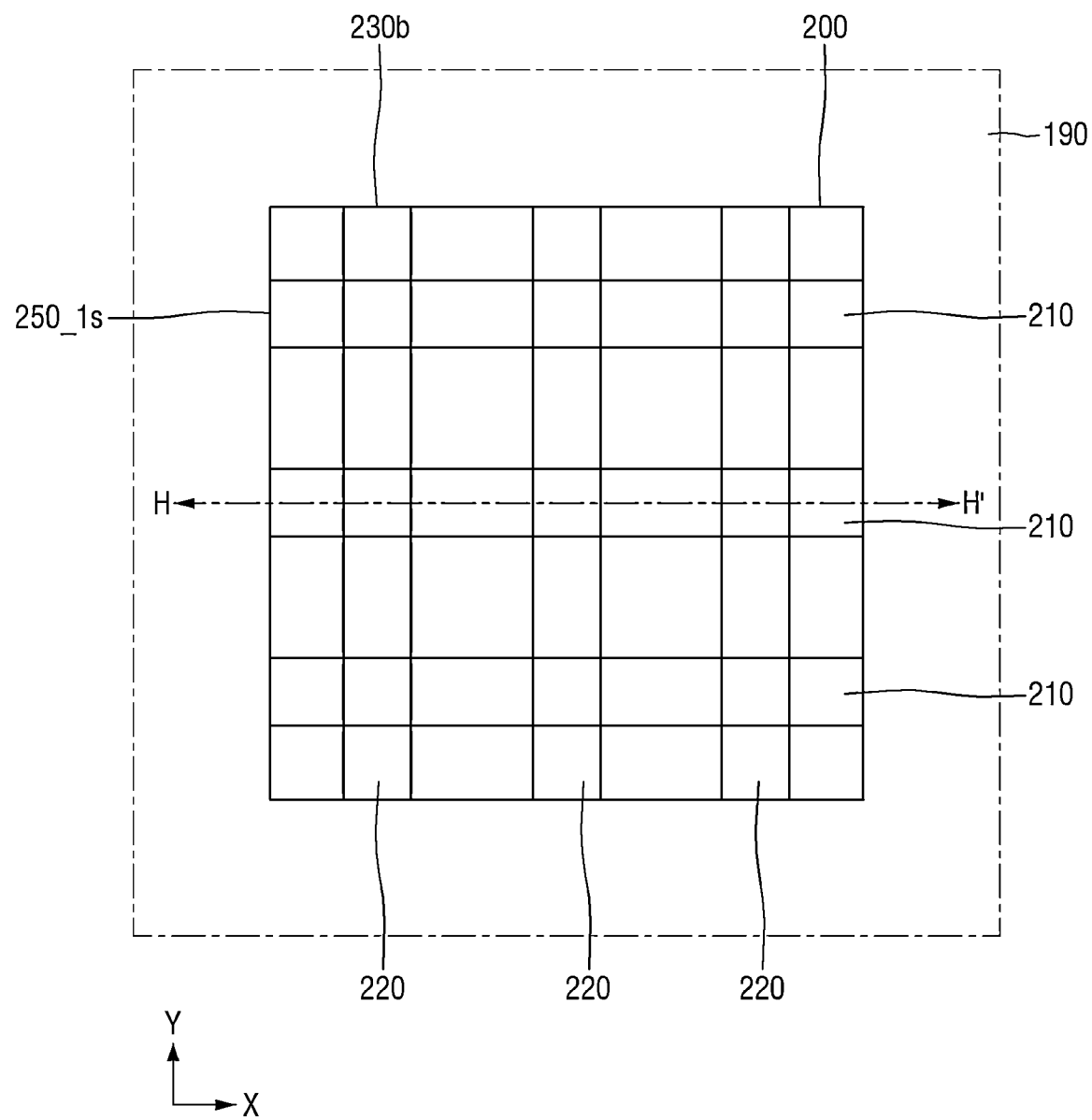
Figure 30:
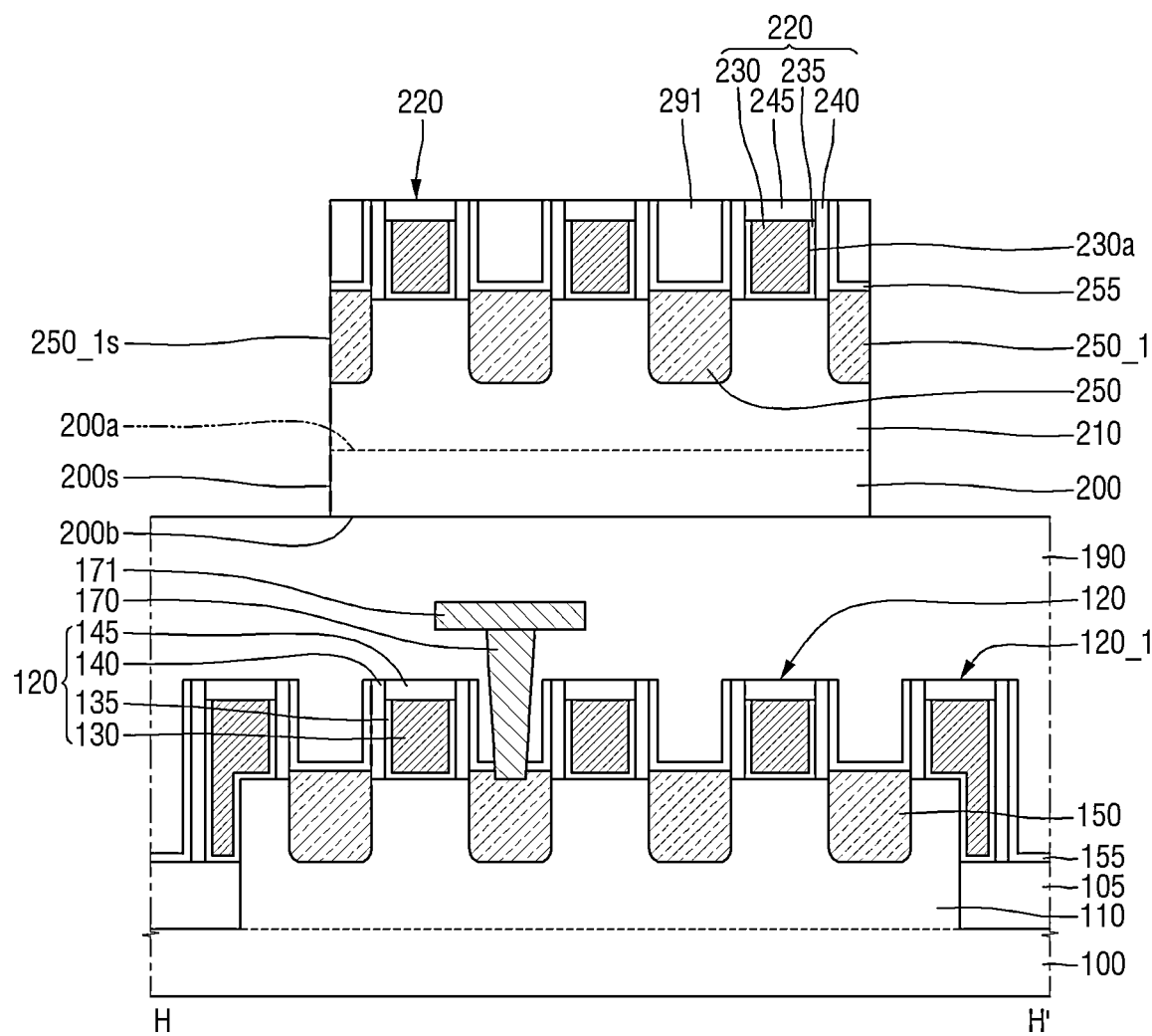

Referring to FIGS. 29 and 30, a first etching process may be performed to remove some of the pre-upper gate structures 220p and some of the first upper source/drain regions 250. In addition, a second etching process may be performed to partially remove the upper semiconductor substrate 200p.

After the first etching process and the second etching process, a first upper semiconductor substrate 200, a plurality of first upper gate structures 220, a plurality of first upper source/drain regions 250, and a plurality of first upper fin patterns 210 may be left at positions corresponding to the first active region ACT 1 (see FIG. 2).

A mask pattern used in the first etching process and a mask pattern used in the second etching process may be the same as, or different from, each other.

Through the first etching process, short sidewalls 230b of upper gate electrodes may be formed, and cut surfaces 250_1s of first cut upper source/drain regions 250_1 may be formed.

Through the second etching process, sidewalls 200s of the first upper semiconductor substrate 200 may be formed.

Next, referring to FIG. 30, an upper interlayer insulating film 290 may be formed on the lower interlayer insulating film 190 to cover the sidewalls 200s of the first upper semiconductor substrate 200.

After the formation of the upper interlayer insulating film 290, an upper source/drain connection contact 270 may be formed.

Unlike in the drawings, fin transistors including the first upper fin patterns 210 may not be formed on the upper semiconductor substrate 200p. Alternatively or additionally, planar transistors may be formed. In this case, the first upper semiconductor substrate 200 may be a semiconductor substrate without an element isolation layer. Here, a first upper source/drain region 250 extending in the second direction Y may be formed between a plurality of first upper gate structures 220 extending in the second direction Y.

Figure 31:
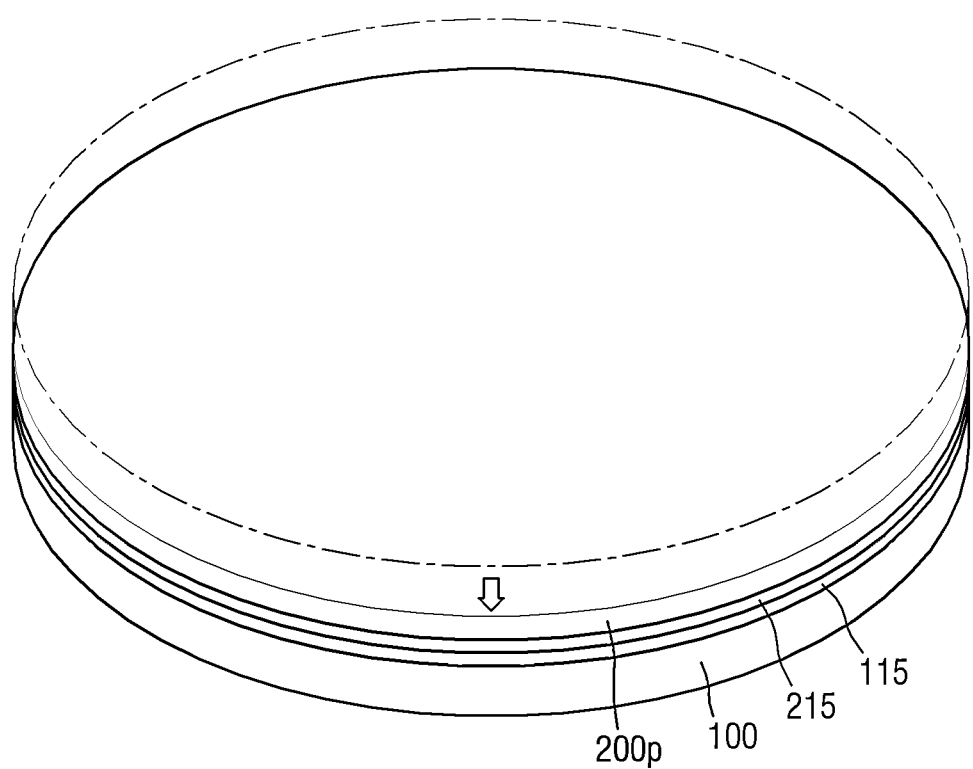
FIG. 31 is a view for explaining steps of a method of fabricating a semiconductor device according to some example embodiments.

FIG. 31 is a view for explaining steps of a method of fabricating a semiconductor device according to some example embodiments. FIG. 31 may be a process performed after FIGS. 23 through 26.

Referring to FIG. 31, a lower semiconductor substrate 100 and an upper semiconductor substrate 200p may be bonded together by placing an upper element region 215 and a lower element region 115 to face each other.

The upper semiconductor substrate 200p may be partially removed to reduce the thickness of the upper semiconductor substrate 200p.

Then, a second etching process may be performed to partially remove the upper semiconductor substrate 200p. In addition, a first etching process may be performed to remove some of a plurality of pre-upper gate structures 220p and some of a plurality of first upper source/drain regions 250.

A mask pattern used in the second etching process and a mask pattern used in the first etching process may be the same as, or different from, each other.

For example, if the mask pattern used in the second etching process and the mask pattern used in the first etching process are the same, a semiconductor device such as the one illustrated in FIGS. 12 through 14 may be fabricated.

For another example, if the mask pattern used in the second etching process and the mask pattern used in the first etching process are different from each other, a semiconductor device such as the one illustrated in FIGS. 15 through 18 may be fabricated.

The foregoing is illustrative of example embodiments and is not to be construed as limiting thereof. Although a few example embodiments have been described, those of ordinary skill in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A method of fabricating a semiconductor device, the method comprising:
    forming, in a first active region of a lower semiconductor substrate, a plurality of lower transistors, which comprise a plurality of lower gate structures and a plurality of lower source/drain regions;
    forming, on the lower semiconductor substrate, a lower interlayer insulating film, covering the plurality of lower gate structures and the plurality of lower source/drain regions;
    forming, in an upper semiconductor substrate, a plurality of upper transistors, which comprise a plurality of upper gate structures and a plurality of upper source/drain regions;
    bonding the upper semiconductor substrate onto the lower interlayer insulating film;
    after the bonding of the upper semiconductor substrate onto the lower interlayer insulating film, performing a first etching process to remove some of the plurality of upper gate structures and some of the plurality of upper source/drain regions;
    after the bonding of the upper semiconductor substrate onto the lower interlayer insulating film, performing a second etching process to partially remove the upper semiconductor substrate; and
    after the first etching process and the second etching process, forming a connection contact, connecting at least one of the plurality of lower transistors to at least one of the plurality of upper transistors.

2. The method of fabricating a semiconductor device of claim 1, further comprising:
    forming a lower source/drain contact and a lower landing pad connected to the lower source/drain region in the lower interlayer insulating film.

3. The method of fabricating a semiconductor device of claim 2, wherein the plurality of lower transistors, the lower source/drain contact, and the lower landing pad are formed in a lower element region on the lower semiconductor substrate.

4. The method of fabricating a semiconductor device of claim 1, wherein the forming of the plurality of upper transistors further comprising:
    forming a plurality of pre-upper fin patterns extending in a first direction and the plurality of upper gate structures extending in a second direction intersecting the first direction to be regularly arranged on the upper semiconductor substrate.

5. The method of fabricating a semiconductor device of claim 4, wherein the plurality of upper transistors is formed in an upper element region on the upper semiconductor substrate.

6. The method of fabricating a semiconductor device of claim 5, further comprising:
    removing a first portion of the upper semiconductor substrate to leave a second portion of the upper semiconductor substrate under the upper element region.

7. The method of fabricating a semiconductor device of claim 4, further comprising:
    forming misalignment of the pre-upper gate structures and the lower gate structures after the bonding of the upper semiconductor substrate and the lower semiconductor substrate, and
    wherein the magnitude of the misalignment is less than half the distance between corresponding sidewalls of adjacent lower gate structures.

8. The method of fabricating a semiconductor device of claim 1, wherein after the first etching process and the second etching process, a first upper semiconductor substrate, a plurality of first upper gate structures, a plurality of first upper source/drain regions, and a plurality of first upper fin patterns are formed in a region corresponding to the first active region.

9. The method of fabricating a semiconductor device of claim 8, further comprising:
    forming short sidewalls of upper gate electrodes and cut surfaces of first cut upper source/drain regions through the first etching process, and
    forming sidewalls of the first upper semiconductor substrate through the second etching process.

10. The method of fabricating a semiconductor device of claim 9, further comprising:
    forming an upper interlayer insulating film on the lower interlayer insulating film covering the sidewalls of the first upper semiconductor substrate.

11. The method of fabricating a semiconductor device of claim 1, wherein a mask pattern used in the first etching process is the same as a mask pattern used in the second etching process.

12. The method of fabricating a semiconductor device of claim 1, wherein a mask pattern used in the first etching process is different from a mask pattern used in the second etching process.

13. A method of fabricating a semiconductor device, the method comprising:
    forming a lower semiconductor substrate;
    forming a lower gate structure on the lower semiconductor substrate, the lower gate structure comprising a lower gate electrode;
    forming a lower interlayer insulating film on the lower semiconductor substrate, the lower interlayer insulating film covering the lower gate structure;
    forming an upper semiconductor substrate on the lower interlayer insulating film;
    forming an upper gate structure on the lower interlayer insulating film; and
    forming an upper interlayer insulating film on the lower interlayer insulating film, the upper interlayer insulating film covering sidewalls of the upper semiconductor substrate,
    wherein the upper gate structure comprises an upper gate electrode extending in a first direction, and upper gate spacers extending along sidewalls of the upper gate electrode,
    wherein the upper gate electrode comprises long sidewalls extending in the first direction, and short sidewalls extending in a second direction, the second direction different from the first direction, and
    wherein the upper gate spacers are on the long sidewalls of the upper gate electrode and are not on the short sidewalls of the upper gate electrode.

14. The method of fabricating a semiconductor device of claim 13, further comprising:
    forming a connection contact penetrating the upper semiconductor substrate, wherein the connection contact electrically connects a lower transistor to an upper transistor, the lower transistor comprising the lower gate electrode and the upper transistor comprising the upper gate electrode.

15. The method of fabricating a semiconductor device of claim 13, further comprising:
    forming a connection contact in the upper interlayer insulating film and in the lower interlayer insulating film, wherein
    the connection contact electrically connects a lower transistor to an upper transistor, the lower transistor comprising the lower gate electrode, the upper transistor comprising the upper gate electrode,
    the connection contact is on an upper surface of the lower semiconductor substrate which is not overlapped by the upper semiconductor substrate.

16. The method of fabricating a semiconductor device of claim 13, wherein the lower gate structure, the upper semiconductor substrate and the upper gate structure are sequentially stacked on the lower semiconductor substrate.

17. The method of fabricating a semiconductor device of claim 13, wherein the lower gate structure and the upper gate structure are between the lower semiconductor substrate and the upper semiconductor substrate.

18. The method of fabricating a semiconductor device of claim 13, wherein, in the first direction, a portion of the upper gate structure protrudes further than the sidewalls of the upper semiconductor substrate.

19. The method of fabricating a semiconductor device of claim 13, further comprising:
    forming a lower gate contact which contacts the lower gate electrode;
    forming a landing pad which contacts the lower gate contact; and
    forming a connection contact which is connected to an upper transistor, the upper transistor comprising the upper gate electrode,
    wherein the connection contact directly connects to the landing pad.

20. A method of fabricating a semiconductor device, the method comprising:
    forming a lower semiconductor substrate comprising a first region and a second region defined around the first region;
    forming a plurality of lower transistors in the lower semiconductor substrate, the plurality of lower transistors comprising a plurality of lower gate structures and a plurality of lower source/drain regions, the plurality of lower gate structures extending in a first direction, and the plurality of lower source/drain regions being between the plurality of lower gate structures;
    forming a lower interlayer insulating film on the lower semiconductor substrate, the lower interlayer insulating film covering the plurality of lower gate structures and the plurality of lower source/drain regions;
    forming an upper semiconductor substrate on the lower interlayer insulating film of the first region of the lower semiconductor substrate;
    forming an upper interlayer insulating film on the lower interlayer insulating film, the upper interlayer insulating film covering sidewalls of the upper semiconductor substrate;
    forming a plurality of upper transistors in the upper semiconductor substrate, the plurality of upper transistors being at positions overlapping the first region of the lower semiconductor substrate, the plurality of upper transistors comprising a plurality of upper gate structures and a plurality of upper source/drain regions, the plurality of upper gate structures extending in the first direction, and the plurality of upper source/drain regions being between the plurality of upper gate structures;
    forming a first connection contact connecting at least one of the plurality of upper gate structures to at least one of the plurality of lower transistors; and
    forming a second connection contact connecting at least one of the plurality of upper source/drain regions to at least one of the plurality of lower transistors, wherein at least one of the first connection contact and the second connection contact penetrates the upper semiconductor substrate, and wherein at least one of the lower transistor and the upper transistor includes a nanosheet.

\* \* \* \* \*